United States Patent
Sakai et al.

(10) Patent No.: US 9,924,593 B2
(45) Date of Patent: Mar. 20, 2018

(54) GRAPHENE WIRING STRUCTURE AND METHOD FOR MANUFACTURING GRAPHENE WIRING STRUCTURE

(71) Applicant: Kabushiki Kaisha Toshiba, Minato-ku (JP)

(72) Inventors: Tadashi Sakai, Yokohama (JP); Yuichi Yamazaki, Inagi (JP); Hisao Miyazaki, Yokohama (JP); Masayuki Katagiri, Kawasaki (JP); Taishi Ishikura, Kuwana (JP); Akihiro Kajita, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/254,353

(22) Filed: Sep. 1, 2016

(65) Prior Publication Data

US 2017/0079138 A1    Mar. 16, 2017

(30) Foreign Application Priority Data

Sep. 11, 2015    (JP) ................................ 2015-179856

(51) Int. Cl.
*H05K 1/09* (2006.01)
*H05K 1/11* (2006.01)
(Continued)

(52) U.S. Cl.
CPC ................ *H05K 1/09* (2013.01); *G11C 11/00* (2013.01); *H01L 21/768* (2013.01);
(Continued)

(58) Field of Classification Search
CPC ......... H01L 21/02; H01L 21/30; H01L 21/31; H01L 21/201; H01L 21/283;
(Continued)

(56) References Cited

U.S. PATENT DOCUMENTS 5,539,845 A * 7/1996 van der Tol ........... G02B 6/126
  216/24
5,922,216 A * 7/1999 Van Der Tol .......... G02B 6/125
  216/17
(Continued)

FOREIGN PATENT DOCUMENTS

JP    2006-120730 A    5/2006
JP    2009-540798 A    11/2009
(Continued)

OTHER PUBLICATIONS

U.S. Appl. No. 14/202,017, filed Mar. 10, 2014, 2014/0284799 A1, Masayuki Katagiri et al.
(Continued)

*Primary Examiner* — Xiaoliang Chen
(74) *Attorney, Agent, or Firm* — Oblon, McClelland, Maier & Neustadt, L.L.P.

(57) ABSTRACT

A graphene wiring structure of an embodiment has a substrate, a metal part on the substrate, multilayered graphene connected to the metal part, a first insulative film on the substrate, and a second insulative film on the substrate. The metal part is present between the first insulative film and the second insulative film. Edges of the multilayered graphene are connected to the metal part. A side face of the first insulative film vertical to the substrate opposes a side face of the second insulative film vertical to the substrate. A first outer face of the multilayered graphene is in physical contact with a first side face of the first insulative film vertical to the substrate. A second outer face of the multilayered graphene is in physical contact with a second side face of the second insulative film vertical to the substrate.

15 Claims, 27 Drawing Sheets

Faces of 3A and 4A at least partly overlap each other

Faces of 3B and 5A at least partly overlap each other

(51) Int. Cl.
*H05K 1/03* (2006.01)
*H05K 3/14* (2006.01)
*H05K 3/40* (2006.01)
*G11C 11/00* (2006.01)
*H01L 21/768* (2006.01)

(52) U.S. Cl.
CPC ........... *H05K 1/0306* (2013.01); *H05K 1/115* (2013.01); *H05K 3/146* (2013.01); *H05K 3/4076* (2013.01); *H05K 2201/0323* (2013.01)

(58) Field of Classification Search
CPC ..... H01L 21/302; H01L 23/532; H01L 29/15; H01L 29/66; H01L 29/201
USPC ............. 174/251; 257/13, 29, 746, 750, 762
See application file for complete search history.

(56) References Cited

U.S. PATENT DOCUMENTS

| | | | |
|---|---|---|---|
| 8,378,335 B2 | 2/2013 | Yamazaki et al. | |
| 8,482,126 B2* | 7/2013 | Wada | H01L 23/5226 257/222 |
| 2004/0257714 A1* | 12/2004 | Takahashi | B82Y 10/00 360/322 |
| 2007/0059645 A1* | 3/2007 | Tang | H01L 51/0545 430/311 |
| 2007/0205450 A1 | 9/2007 | Okita | |
| 2007/0251449 A1* | 11/2007 | Mizuno | G03F 7/162 118/668 |
| 2007/0253116 A1* | 11/2007 | Takahashi | B82Y 25/00 360/313 |
| 2008/0176107 A1* | 7/2008 | Takahashi | G11B 5/3903 428/810 |
| 2009/0299213 A1 | 12/2009 | Patolsky et al. | |
| 2011/0006425 A1 | 1/2011 | Wada et al. | |
| 2012/0052680 A1 | 3/2012 | Sakuma et al. | |
| 2012/0068160 A1 | 3/2012 | Yamazaki et al. | |
| 2012/0080662 A1* | 4/2012 | Saito | H01L 21/28556 257/29 |
| 2012/0080796 A1 | 4/2012 | Wada et al. | |
| 2012/0153257 A1* | 6/2012 | Nam | H01L 33/20 257/13 |
| 2012/0319081 A1* | 12/2012 | Jeon | H01L 33/08 257/13 |
| 2013/0056873 A1* | 3/2013 | Wada | H01L 23/5226 257/746 |
| 2013/0134592 A1 | 5/2013 | Yamazaki et al. | |
| 2014/0084250 A1* | 3/2014 | Wada | H01L 23/53276 257/29 |
| 2014/0138829 A1 | 5/2014 | Zhao et al. | |
| 2014/0231751 A1* | 8/2014 | Wada | H01L 29/1606 257/29 |
| 2014/0284799 A1 | 9/2014 | Katagiri et al. | |
| 2014/0284802 A1* | 9/2014 | Sakata | H01L 21/76805 257/762 |
| 2015/0235960 A1 | 8/2015 | Sato et al. | |
| 2016/0172305 A1 | 6/2016 | Sato | |

FOREIGN PATENT DOCUMENTS

| | | |
|---|---|---|
| JP | 2011-23420 A | 2/2011 |
| JP | 2012-49268 A | 3/2012 |
| JP | 2012-64784 | 3/2012 |
| JP | 2012-80014 | 4/2012 |
| JP | 2013-115143 A | 6/2013 |
| JP | 2013-179177 | 9/2013 |
| JP | 2013-179182 | 9/2013 |
| JP | 2014-63912 | 4/2014 |
| JP | 2014-96411 | 5/2014 |
| JP | 2015-5659 A | 1/2015 |
| JP | 2015-61031 A | 3/2015 |
| JP | 2015-61042 A | 3/2015 |
| JP | 5701920 | 4/2015 |
| WO | WO 2006/043329 A1 | 4/2016 |

OTHER PUBLICATIONS

Mark H. Ruemmeli et al. "Oxide-Driven Carbon Nanotube Growth in Supported Catalyst CVD", J. Am. Chem. Soc., vol. 129, 2007, 2 pages.

Ikusei Nakamura et al. "Catalyst Design Considering on Spillover and Reverse Spillover Phenomenon", Sekiyu Gakkaishi, vol. 38, No. 5, 1995, 9 pages (with English Summary and Partial English Translation).

Jiong Zhao et al. "A Growth Mechanism for Free-Standing Vertical Graphene" Nano Letters, vol. 14, 2014, 8 pages.

* cited by examiner

Faces of 3A and 4A
at least partly overlap each other

Faces of 3B and 5A
at least partly overlap each other

Faces of 3A and 4A  
at least partly overlap each other

Faces of 3B and 5A  
at least partly overlap each other

GRAPHENE WIRING STRUCTURE AND METHOD FOR MANUFACTURING GRAPHENE WIRING STRUCTURE

CROSS-REFERENCE TO RELATED APPLICATION

This application is based upon and claims the benefit of priority from Japanese Patent Application No. 2015-179856, filed on Sep. 11, 2015, the entire contents of which are incorporated herein by reference.

FIELD

Embodiments described herein relate to a graphene wiring structure and a method for manufacturing the graphene wiring structure.

BACKGROUND

A multilayered wiring in a chip is required to be finer along with higher integration and miniaturization in a memory and the like, and it is expected that the most recent flash memory reaches a half pitch of 10 nm or less around 2020. On the other hand, resistivity is rapidly increasing along with the miniaturization due to an increase in inelastic scattering of a generally-used metal wiring of Cu or the like, and is reaching the limit of the material. To the contrary, it is reported that a nano-carbon material such as graphene or carbon nanotube (CNT) has a remarkably longer mean free path or higher mobility also in a finer area than the metals, which is expected as a next-generation fine wiring material. In particular, graphene may form a fine-width wiring in a lithography process well compatible with the existing LSI process, and fine-width integrated wiring based on multi-layered graphene by CVD (Chemical Vapor Deposition) is increasingly developed.

A method for manufacturing the fine-width wiring structure using multilayered graphene is basically to pattern entirely-grown catalyst, but there is a problem that a metal material such as Fe, Co or Ni having a capability to dissolve and precipitate carbon at a low temperature is difficult to etch. As a solution thereto, there is proposed a method for performing damascene wiring on a catalyst metal and patterning it thereby to selectively grow carbon on the wiring. A carbon layer is precipitated with excellent selectivity on the catalyst metal layer of Ni or the like in a trench patterned by CMP. However, according to the present method, a metal barrier layer for holding Ni is required inside a wiring trench, and a thickness thereof is required on both sides of the trench, which is a remaining problem against finer width.

DETAILED DESCRIPTION

Figure 1:
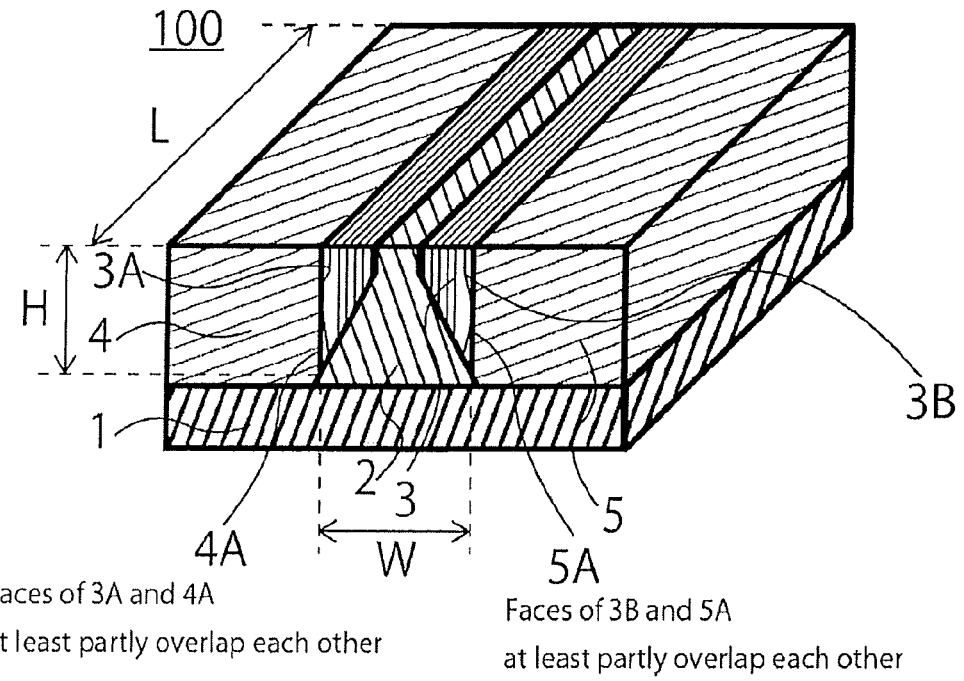
FIG. 1 is a perspective conceptual diagram of a graphene wiring structure according to a first embodiment.

A graphene wiring structure of an embodiment has a substrate, a metal part on the substrate, multilayered graphene connected to the metal part, a first insulative film on the substrate, and a second insulative film on the substrate. The metal part is present between the first insulative film and the second insulative film. Edges of the multilayered graphene are connected to the metal part. A side face of the first insulative film vertical to the substrate opposes a side face of the second insulative film vertical to the substrate. A first outer face of the multilayered graphene is in physical contact with a first side face of the first insulative film vertical to the substrate. A second outer face of the multilayered graphene is in physical contact with a second side face of the second insulative film vertical to the substrate.

A method for manufacturing a graphene wiring structure of an embodiment includes forming a metal part on a substrate between the insulative films by depositing a catalyst metal on the substrate where insulative films are formed with a gap, and growing multilayered graphene from the metal part by supplying hydrocarbon-containing gas. The substrate between the metal part and the insulative films is exposed. The substrate is an insulative member having hydrocarbon decomposition catalyst characteristics.

The graphene wiring structures according to embodiments will be described below. Upper and lower are the directions illustrated in the drawings unless particularly stated. Reference numerals for symmetrical components in the drawings are partially omitted.

(First Embodiment)

A first embodiment relates to a graphene wiring structure. The graphene wiring structure according to the first embodiment will be described below with reference to the perspective conceptual diagrams of FIG. 1 and FIG. 2. FIG. 1 illustrates a perspective conceptual diagram of the graphene wiring structure 100 according to the first embodiment. The graphene wiring structure 100 in FIG. 1 comprises a substrate 1, a metal part 2 with the wiring length direction on the substrate 1 as longitudinal direction, multilayered graphene 3 connected to the metal part 2, a first insulative film 4 on the substrate 1, and a second insulative film 5 on the substrate 1. The ends of the multilayered graphene 3 are electrically connected to a conductive member or semiconductor device (not illustrated). In FIG. 1, there is configured such that the multilayered graphene 3 and the metal part 2 are exposed, but according to a variant of the embodiment, there is configured such that the multilayered graphene 3 and the metal part 2 are covered with an insulative film.

(Substrate 1)

The substrate 1 is of the graphene wiring structure 100. The substrate 1 is a member configured to support the graphene wiring structure and to have hydrocarbon decomposition catalyst characteristics. Any insulative member having hydrocarbon decomposition catalyst characteristics is suitable for the substrate 1. Specifically, the substrate 1 preferably employs aluminum oxide ($Al_2O_3$) or titanium oxide ($TiO_2$).

(Metal Part 2)

The metal part 2 is present between the first insulative film 4 and the second insulative film 5 on the substrate 1. The metal part 2 is continuously present on the substrate 1. The metal part 2 assumes the wiring length direction of the wiring structure (the wiring length direction of the multilayered graphene 3) as longitudinal direction. The metal part 2 is preferably of a ridge type shape. The metal part is a metal line that extends to the wiring length direction on the substrate 1. The metal part 2 is preferably a catalyst metal having carbon solid solubility as the start of growth of the multilayered graphene 3. The metal part is preferably a metal or alloy containing Fe, Ta, or Mo. The wiring length direction of the wiring structure is the wiring length direction of the graphene. The width of the metal part 2 is preferably between 1 nm and 20 nm.

The shape of the metal part 2 may have the flat top face, may have the side faces vertical to the substrate 1, or may be tilted as illustrated in the perspective conceptual diagrams of FIG. 2(A) and FIG. 2(B). Further, it may have a semi-circular cross-section shape (D-shape) as illustrated in FIG. 2(C). The sides of the metal part 2 preferably include [111] plane, [110]plane, [100] plane, or [n00] plane of a catalyst metal.

(Multilayered Graphene 3)

The multilayered graphene 3 may employ laminated graphene sheets. The graphene sheets configuring the multilayered graphene 3 are planar graphene sheets. The edge of one side of the multilayered graphene 3 is connected to the metal part 2. The multilayered graphene 3 is multilayered planar graphene sheets grown from the metal part 2. The planar graphene sheets are laminated in the width direction of the wiring.

The wiring width W of the multilayered graphene 3 is preferably between 0.5 nm and 20 nm. When the wiring width is smaller than 0.5 nm, a single graphene sheet is caused in the multilayered graphene. Further, when the wiring width W of the multilayered graphene 3 is larger than 20 nm, it is not preferable that the width of the graphene wiring structure according to the embodiment is larger and a fine wiring cannot be obtained.

Figure 2:
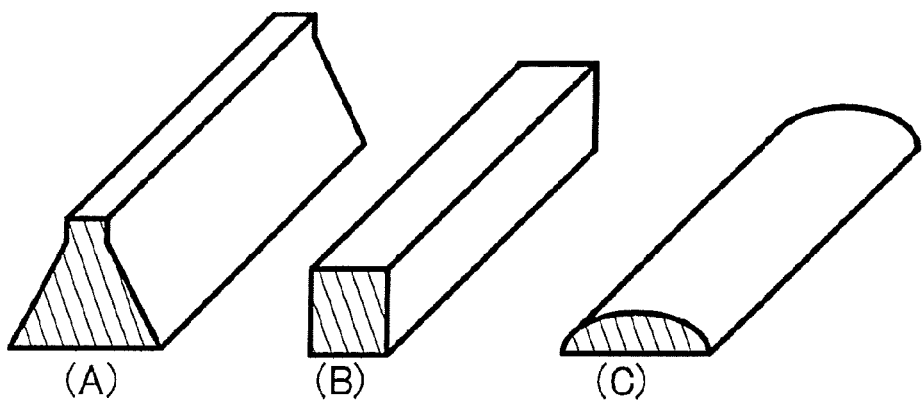
FIG. 2(A), FIG. 2(B) and FIG. 2(C) illustrate perspective conceptual diagrams of a metal part according to the first embodiment.

The wiring width of the multilayered graphene 3 is a distance in the laminated direction of the multilayered graphene 3 from a first outer face 3A to a second outer face 3B of the multilayered graphene 3 as indicated in "W" in the conceptual diagram of FIG. 2. The first outer face 3A is the outermost graphene sheet of the multilayered graphene 3 on the first insulative film 4 side. The second outer face 3B is the outermost graphene sheet of the multilayered graphene 3 on the second insulative film 5 side.

The wiring height of the multilayered graphene 3 is a length of the multilayered graphene 3 in the vertical direction relative to the substrate 1 as indicated in "H" in the conceptual diagram of FIG. 1. More specifically, it is a distance between the nearest point to the substrate 1 and the farthest point from the substrate 1 of the graphene sheets configuring the multilayered graphene. A plurality of graphene sheets configure the multilayered graphene 3, and thus the longest distance thereof is the wiring height H.

Further, the wiring length of the multilayered graphene 3 is a length of the multilayered graphene 3 in the plane direction of the substrate 1 as indicated in "L" in the conceptual diagram of FIG. 1. The length direction of the multilayered graphene 3 is vertical in the wiring width direction of the multilayered graphene 3, and is vertical in the wiring height direction of the multilayered graphene 3.

A ratio of H/W between the wiring height H and the wiring width W is preferably 1 or more. This is because when H/W is lower than 1, a wiring aspect ratio can be increased due to graphene growth in the height direction as one inventiveness and thus an effect of reducing sheet resistance cannot be sufficiently produced and the wiring area increases.

(First Insulative Film 4)

The first insulative film 4 is an insulative film on the substrate 1. The first insulative film 4 is a member configured to support the multilayered graphene 3 to be vertical to the substrate 1. A side face of the first insulative film 4 on the multilayered graphene 3 side, which is a side face of the first insulative film 4 vertical to the substrate 1, is assumed as a first side face 4A of the first insulative film 4. The first side face 4A of the first insulative film 4 is in physical contact with the first outer face 3A as one outer face of the multilayered graphene 3. The first insulative film 4 is not particularly limited if it is insulative. The first insulative film 4 may employ a resist film, an insulative film such as $SiO_2$ film used for semiconductor devices, $Al_2O_3$ or TiN used for the substrate 1, or the like. When the side faces of the metal part 2 are tilted, there is a point where the three members including the first insulative film 4, the substrate 1, and the metal part 2 are connected. The first side face 4A of the first insulative film 4 is in physical contact with the first outer face 3A of the multilayered graphene 3, and thus the first outer face 3A of the multilayered graphene 3 overlaps the first side face 4A of the first insulative film 4.

(Second Insulative Film 5)

The second insulative film 5 is an insulative film on the substrate 1. The second insulative film 5 is a member configured to support the multilayered graphene 3 to be vertical to the substrate 1. A side face of the second insulative film on the multilayered graphene 3 side, which is a side face of the second insulative film 5 vertical to the substrate 1, is assumed as a first side face 5A of the second insulative film 5. The first side face 5A of the second insulative film 5 is in physical contact with the second outer face 3B as the other outer face of the multilayered graphene 3. The first side face 5A of the second insulative film 5 opposes the first side face 4A of the first insulative film 4. The multilayered graphene and the metal part 2 are present between the first side face 5A of the second insulative film 5 and the first side face 4A of the first insulative film 4. The second insulative film 5 is not particularly limited if it is insulative. The second insulative film 5 may employ the materials listed for the first insulative film 4. The first insulative film 4 and the second insulative film 5 are preferably made of the same material. When the side faces of the metal part 2 are tilted, there is a point where the three members including the second insulative film 5, the substrate 1, and the metal part 2 are connected. The second side face 5A of the second insulative film 5 is in physical contact with the second outer face 3B of the multilayered graphene 3, and thus the first outer face 3A of the multilayered graphene 3 overlaps the first side face 4B of the second insulative film 5 in FIG. 1.

A rate of the area where the first side face 4A of the first insulative film 4 is in physical contact with the first outer face 3A as one outer face of the multilayered graphene 3 is preferably 20% or more, and more preferably 50% or more. The area where the first side face 4A of the first insulative film 4 is in physical contact with the multilayered graphene 3 is obtained by equally dividing the graphene wiring structure 100 into 10 segments in the wiring length direction and measuring a ratio of the length along which the first side face 4A of the first insulative film 4 is in physical contact with the multilayered graphene 3 in the resultant nine cross-sections. The cross-sections are observed by the millionfold-enlarged images by use of a transmission electron microscope. A mean value of the ratios at seven points except for the minimum value and the maximum value among the measurement values at the nine cross-sections is assumed as a rate of the area where the first side face 4A of the first insulative film 4 is in physical contact with the multilayered graphene 3. A preferable rate of the area where the first side face 5A of the second insulative film 5 is in physical contact with the second outer face 3B as the other outer face of the multilayered graphene 3 is the same as a rate of the area of the first insulative film 4. The area where the first side face 5A of the second insulative film 5 is in physical contact with the second outer face 3B as the other outer face of the multilayered graphene 3 can be found in the same method for the first insulative film 4. The wiring width W and the wiring height H of the multilayered graphene 3 can be found by use of shot images of the transmission electron microscope used for finding a rate of the area where the first side face 4A of the first insulative film 4 is in physical contact with the first outer face 3A as one outer face of the multilayered graphene 3. Further, the wiring length of the multilayered graphene 3 can be found by observing the cross section including the metal part 2 and the multilayered graphene 3 which is vertical in the wiring width W direction.

A method for manufacturing the graphene wiring structure 100 according to the first embodiment preferably comprises forming a metal part on the substrate between the insulative films by depositing a catalyst metal on a substrate where insulative films are formed with a gap, and growing multilayered graphene from the metal part by supplying hydrocarbon-containing gas. It is preferable to expose the substrate between the metal part and the insulative films formed in the step of forming the metal part on the substrate by depositing a catalyst metal on the substrate where the insulative films are present with a gap therebetween. The substrate is preferably an insulative member having hydrocarbon decomposition catalyst characteristics.

The method for manufacturing the graphene wiring structure 100 according to the first embodiment will be specifically described below with reference to the step conceptual diagrams (cross-section views) of FIG. 3 to FIG. 6.

Figure 3:
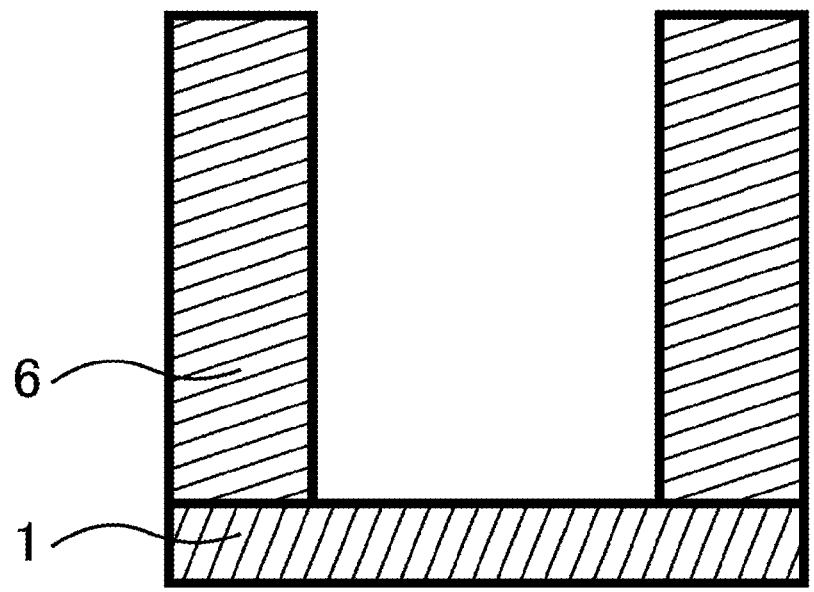
FIG. 3 is a conceptual diagram of a step of manufacturing the graphene wiring structure according to the first embodiment.

The member in the step conceptual diagram of FIG. 3 includes the substrate 1 with third insulative films 6 formed thereon. The substrate 1 is preferably an insulative member having hydrocarbon decomposition catalyst characteristics described above. A gap is present between the third insulative films 6, and thus a trench is formed by the third insulative films 6. A catalyst metal is deposited in the member in the step conceptual diagram of FIG. 3 to form the narrow metal part 2, thereby obtaining the member illustrated in the step conceptual diagram of FIG. 4. The substrate 1 may be spattered, for example, while being rotated in order to form the metal part 2. When a shape of the metal part 2 is as illustrated in FIG. 2(B) or 2(C), it may be manufactured by use of a well-known semiconductor manufacture process. At this time, the metal part 2 is formed such that the substrate 1 is exposed between the metal part 2 and the third insulative films 6. Metal films 7 are formed together on top of the third insulative films 6 when the metal part 2 is formed.

Figure 4:
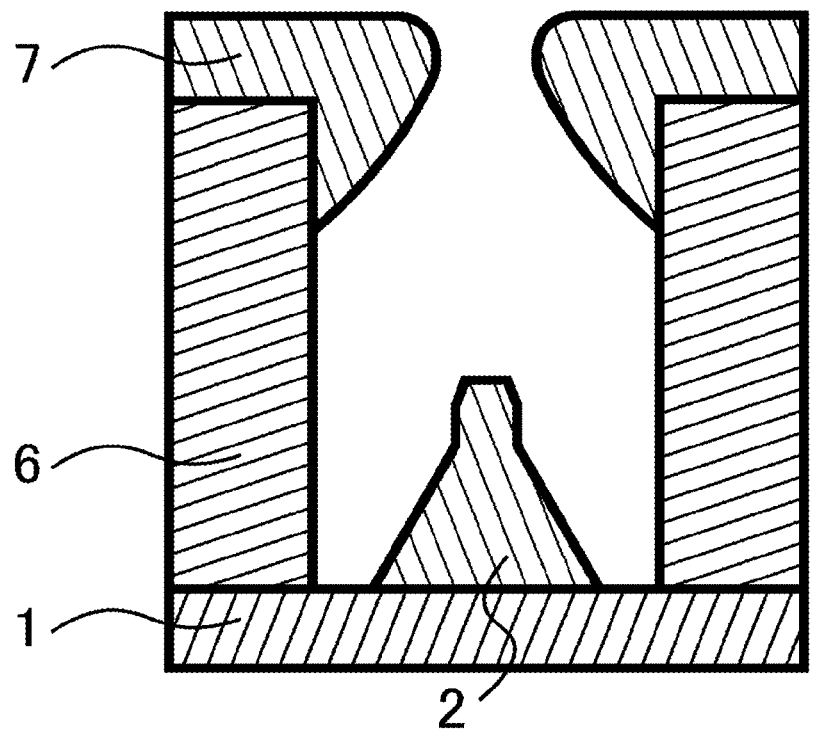
FIG. 4 is a conceptual diagram of a step of manufacturing the graphene wiring structure according to the first embodiment.

Then, the third insulative films 6 in the member in the step conceptual diagram of FIG. 4 are released thereby to remove the third insulative films 6. The metal films 7 on the third insulative films 6 are also removed by the release. Hydrocarbon-containing gas is supplied after the release to heat the substrate 1, to precipitate the multilayered graphene 3 from the metal part 2, and thereby to obtain the member including the multilayered graphene 3 as illustrate in the step conceptual diagram of FIG. 5. The multilayered graphene 3 is precipitated from the metal part 2 so that the edge of one side of the multilayered graphene 3 is connected to the metal part 2. The hydrocarbon-containing gas preferably contains saturated or unsaturated hydrocarbon such as ethylene, methane, acetylene or propane. It is preferable to employ unsaturated hydrocarbon such as ethylene or acetylene in terms of growth of the multilayered graphene. The substrate 1 is preferably heated at 400° C. to 600° C. thereby to precipitate the multilayered graphene 3. The multilayered graphene 3 is generated until the multilayered graphene 3 is grown to have an intended length. Herein, the substrate 1 is made of a member having hydrocarbon decomposition catalyst characteristics, and thus it is assumed that even when the metal part 2 is covered with the graphene sheets configuring the multilayered graphene 3, much solid-soluble carbon is supplied from the substrate 1 to the metal part 2. Then, it is assumed that the multilayered graphene 3 can be generated without the stop of growth of the multilayered graphene 3. When the substrate 1 is covered with the metal part 2, hydrocarbon as a material of the multilayered graphene 3 does not contact the substrate 1 and less solid-soluble carbon is supplied to the metal part 2. When most of the surface of the metal part 2 is covered with the multilayered graphene 3, less carbon is supplied from the gas phase. At this time, the substrate 1 is exposed so that solid-soluble carbon can be supplied to the metal part 2 and the multilayered graphene 3 can be grown to be higher.

Figure 5:
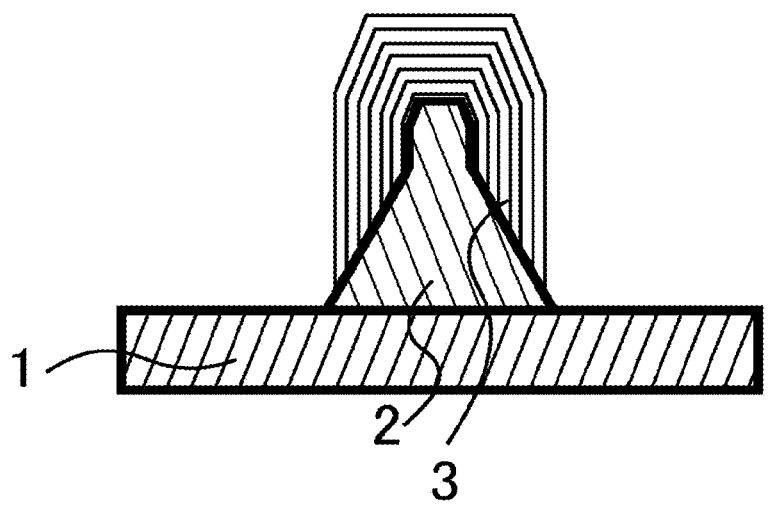
FIG. 5 is a conceptual diagram of a step of manufacturing the graphene wiring structure according to the first embodiment.
Figure 6:
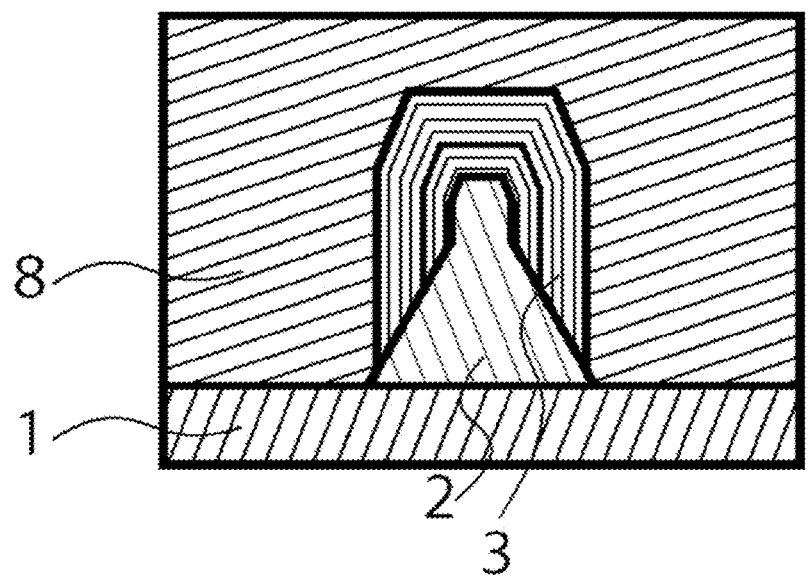
FIG. 6 is a conceptual diagram of a step of manufacturing the graphene wiring structure according to the first embodiment.

Then, a fourth insulative film 8 is formed in the member in the step conceptual diagram of FIG. 5 thereby to obtain the member illustrated in the step conceptual diagram of FIG. 6. The fourth insulative film 8 is formed on the substrate 1 to entirely cover the metal part 2 and the multilayered graphene 3. The fourth insulative film 8 may employ an insulative material used for semiconductor devices, such as $SiO_2$, SOG (Spin On Glass), SOD (SpinOn Dielectric) or HSQ (Hydrogens Slises Quioxane), not particularly limited. As illustrated in FIG. 5, a variant of the graphene wiring structure according to the embodiment includes a structure in which the upper end of the multilayered graphene 3 is not exposed.

Then, CMP (Chemical Mechanical Polishing) is performed on the member illustrated in the step conceptual diagram of FIG. 6 to open the upper end of the multilayered graphene 3, thereby obtaining the graphene wiring structure 100 in FIG. 1.

(Second Embodiment)

Figure 7:
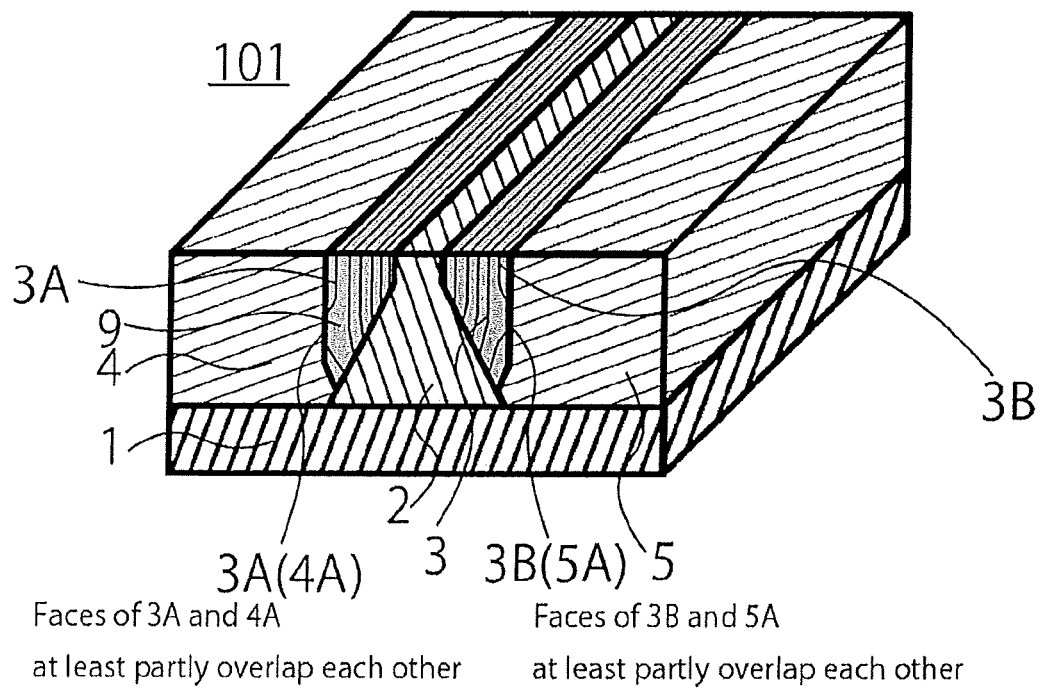
FIG. 7 is a perspective conceptual diagram of a graphene wiring structure according to a second embodiment.

A second embodiment relates to a graphene wiring structure. The graphene wiring structure 101 according to the second embodiment will be described below with reference to the perspective conceptual diagram of FIG. 7. The graphene wiring structure 101 in FIG. 3 comprises the substrate 1, the metal part 2 with the wiring length direction on the substrate 1 as longitudinal direction, the multilayered graphene 3 connected to the metal part 2, the first insulative film 4 on the substrate 1, the second insulative film 5 on the substrate 1, and a first interlayer substance 9 in the multilayered graphene 3. The second embodiment is a variant of the first embodiment. The description of the common structure and manufacture method between the first embodiment and the second embodiment will be omitted.

It is preferable that the first interlayer substance 9 is present in the multilayered graphene 3. It is preferable that the multilayered graphene is lower in resistance due to the presence of the first interlayer substance 9 in the multilayered graphene 3. The first interlayer substance 9 may be present between the first outer face 3A as one outer face of the multilayered graphene 3 and the first side face 4A of the first insulative film 4 or between the second outer face 3B as the other outer face of the multilayered graphene 3 and the first side face 5A of the second insulative film 5 not only in the multilayered graphene. An interlayer distance in the multilayered graphene 3 inserting the first interlayer substance 9 therein ranges from 0.335 nm to 0.7 nm to 1 nm, for example. A distance of 0.335 nm is an interlayer distance between a plurality of graphene sheets configuring the multilayered graphene not inserting an interlayer substance therein. Thus, the wiring width W of the multilayered graphene 3 is preferably between 1 nm and 20 nm.

The first interlayer substance 9 may employ at least one selected from the group consisting of; metal chlorides, metal fluorides, alkali metals, alkali earth metals, halogens, and interhalogen compounds.

The metals contained in the metal chlorides and the metal fluorides may specifically be o at least one metal selected from the group consisting of; Fe, Cu, Al, and Mo. The metal chlorides containing a metal such as Fe, Cu, Al or Mo may be at least one metal chloride selected from the group consisting of; $FeCl_3$, $CuCl_2$, $AlCl_3$, $MoCl_5$, and the like. The metals contained in the metal fluorides may specifically employ B, As and the like. The metal fluorides containing a metal such as B or As may employ at least one metal fluoride selected from the group consisting of; $BF_3$, $AsF_5$, and the like.

The alkali metals may employ at least one metal selected from the group consisting of; Li, Na, K, and the like.

The alkali earth metals may employ at least one metal selected from the group consisting of; Mg, Ca, and the like.

Halogens may employ at least one kind of halogen molecule selected from the group consisting of; $F_2$, $Cl_2$, $Br_2$, $I_2$, and the like.

The interhalogen compounds may employ a compound made of I and other halogen (F, Cl, or Br). More specifically, the halogen compounds may employ at least one compound selected from the group consisting of; IBr, ICl, and the like.

The specific first interlayer substance 9 is preferably at least one metal chloride containing a metal such as Fe, Cu, Al, or Mo, metal fluorides containing a metal such as B or As, and compounds made of Li, Na, K, Mg, Ca, $F_2$, $Cl_2$, $Br_2$, $I_2$, or I and other halogen (F, Cl, or Br).

Specifically, the first interlayer substance 9 is preferably at least one selected from the group consisting of; $FeCl_3$, $CuCl_2$, $AlCl_3$, $MoCl_5$, $BF_3$, $AsF_5$, Li, Na, K, Mg, Ca, $F_2$, $Cl_2$, $Br_2$, $I_2$, IBr, and ICl.

The first interlayer substance 9 can be confirmed by confirming Raman shift of the multilayered graphene 3 including the first interlayer substance 9 therein.

A method for manufacturing the graphene wiring structure 101 according to the second embodiment will be described below with reference to the step conceptual diagrams (cross-section views) of FIG. 8 and FIG. 9.

The method for manufacturing the graphene wiring structure according to the second embodiment comprises a step of depositing a catalyst metal on a substrate where insulative films are formed with a gap therebetween and forming a metal part on the substrate between the insulative films, a step of supplying gas containing carbon and hydrogen and growing multilayered graphene from the metal part, a step of forming an insulative film to cover the multilayered graphene, a step of removing the insulative film to expose the multilayered graphene, and a step of inserting a first interlayer substance in the exposed multilayered graphene. The method for manufacturing the graphene wiring structure 101 according to the second embodiment is different from the method for manufacturing the graphene wiring structure 100 according to the first embodiment in that it further comprises the step of inserting the first interlayer substance 9 subsequent to the steps in the method for manufacturing the graphene wiring structure 100 according to the first embodiment.

After the graphene wiring structure 100 according to the first embodiment illustrated in the conceptual diagram of FIG. 1 is obtained, the first insulative film 4 and the second insulative film 5 are removed thereby to obtain the member with the insulative films removed. Then, the member with the insulative films removed is processed in the atmosphere containing the first interlayer substance 9 and the first interlayer substance 9 is inserted into the multilayered graphene 3 thereby to obtain the member illustrated in the step conceptual diagram of FIG. 8. The atmosphere containing the first interlayer substance 9 includes at least the gasified first interlayer substance 9, and may further include carrier gas such as rare gas.

Figure 8:
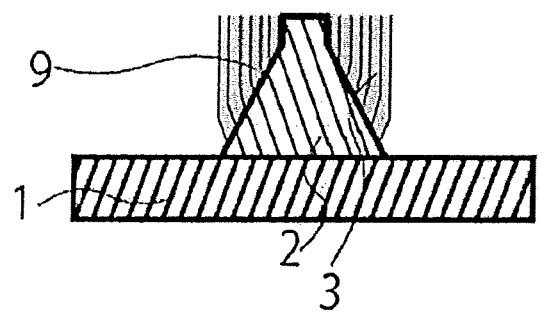
FIG. 8 is a conceptual diagram of a step of manufacturing the graphene wiring structure according to the second embodiment.
Figure 9:
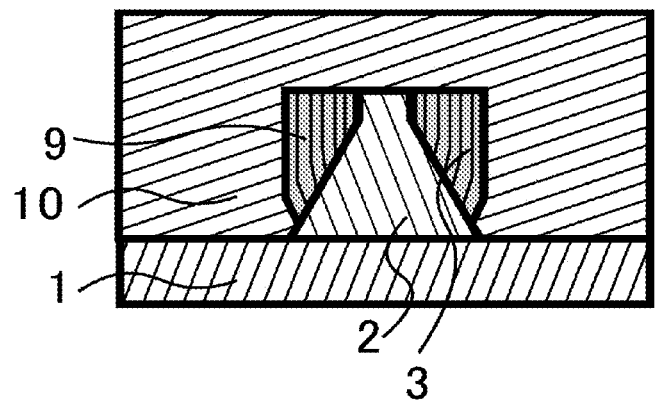
FIG. 9 is a conceptual diagram of a step of manufacturing the graphene wiring structure according to the second embodiment.

Then, a fifth insulative film 10 is formed in the member illustrated in the step conceptual diagram of FIG. 8 thereby to obtain the member illustrated in the step conceptual diagram of FIG. 9. The fifth insulative film 10 is formed on the substrate 1 thereby to entirely cover the metal part 2 and the multilayered graphene 3. The fifth insulative film 10 may employ an insulative material used for semiconductor devices, such as $SiO_2$, SOG (Spin On Glass), SOD (SpinOn Dielectric), or HSQ (Hydrogens Slises Quioxane), not particularly limited. As illustrated in FIG. 9, a variant of the graphene wiring structure according to the embodiment includes a structure in which the upper end of the multilayered graphene 3 is not exposed.

Then, CMP is performed on the member illustrated in the step conceptual diagram of FIG. 6 to open the upper end of the multilayered graphene 3, thereby obtaining the graphene wiring structure 100 in FIG. 1.

(Third Embodiment)

A third embodiment relates to a graphene wiring structure. The graphene wiring structure 102 according to the third embodiment will be described below with reference to the perspective conceptual diagram of FIG. 10. The graphene wiring structure 102 in FIG. 10 comprises the substrate 1, the metal parts 2 with the wiring length direction on the substrate 1 as longitudinal direction, the multilayered graphene 3 connected to the metal parts 2, the first insulative films 4 on the substrate 1, the second insulative films 5 on the substrate 1, and the first interlayer substance 9 in the multilayered graphene 3. The third embodiment is a variant of the first embodiment or the second embodiment. The description of the common structure and manufacture method between the first or second embodiment and the third embodiment will be omitted.

Figure 10:
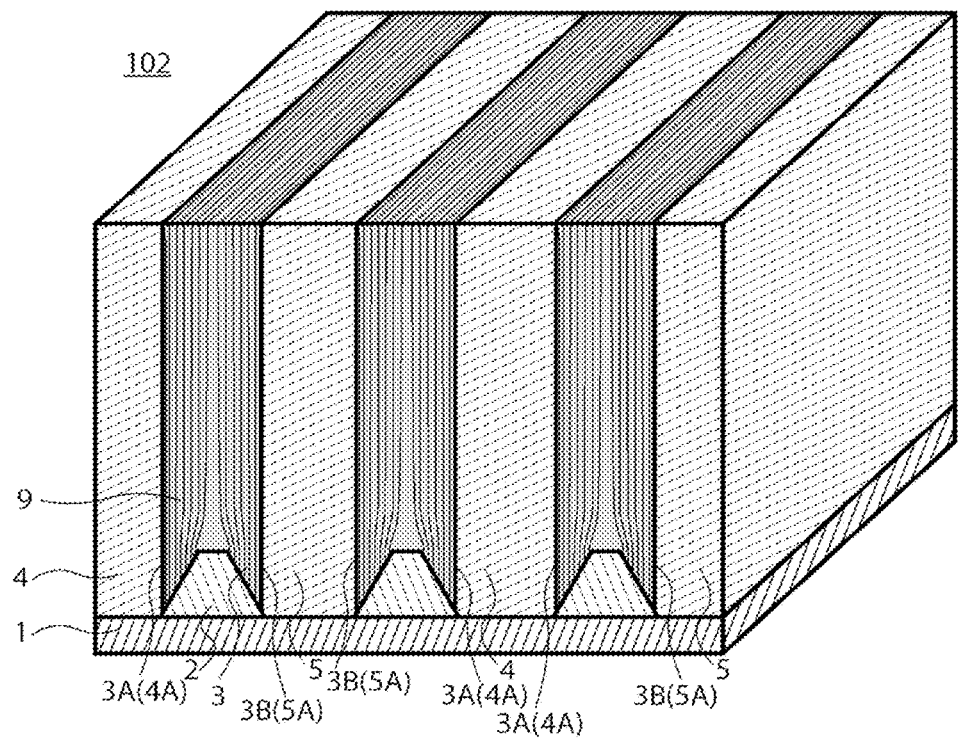
FIG. 10 is a perspective conceptual diagram of a graphene wiring structure according to a third embodiment.

The graphene wiring structure 102 illustrated in FIG. 10 has a three-line wiring structure. The metal part 2 is not exposed but the edges of the multilayered graphene 3 are exposed at the upper end of the graphene wiring structure 102. The graphene wiring structure 102 is larger in wiring height than the graphene wiring structure 100 according to the first embodiment or the graphene wiring structure 101 according to the second embodiment, and thus is suitable for transmitting larger current.

A method for manufacturing the graphene wiring structure according to the third embodiment comprises a step of depositing a catalyst metal on a substrate where insulative films are formed with a gap therebetween, and forming a metal part on the substrate between the insulative films, a step of supplying gas containing carbon and hydrogen and growing multilayered graphene from the metal part, a step of forming an insulative film to cover the multilayered graphene, a step of removing the insulative film to expose the multilayered graphene, and a step of inserting a first interlayer substance into the exposed multilayered graphene. The method for manufacturing the graphene wiring structure 102 according to the third embodiment is different from the method for manufacturing the graphene wiring structure 100 according to the first embodiment in that it further comprises the step of inserting the first interlayer substance 9 subsequent to the steps in the method for manufacturing the graphene wiring structure 100 according to the first embodiment and the multilayered graphene 3 is grown to be higher. In the method for manufacturing the graphene wiring structure 101 according to the second embodiment, the insulative film outside the multilayered graphene 3 is removed, and then the first interlayer substance 9 is inserted into the multilayered graphene 3. On the other hand, the third embodiment is different from the method for manufacturing the graphene wiring structure 101 according to the second embodiment in that the processing of inserting the first interlayer substance 9 is performed on the member where the insulative film is present outside the multilayered graphene 3.

The method for manufacturing the graphene wiring structure 102 according to the third embodiment will be described below with reference to the step conceptual diagrams (cross-section views) of FIG. 11 to FIG. 16.

Figure 11:
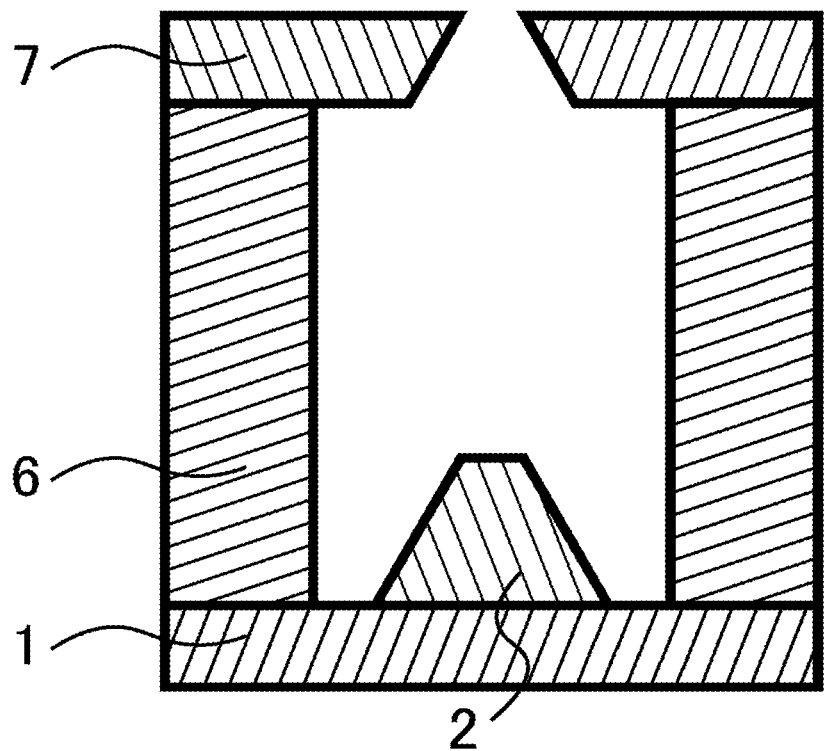
FIG. 11 is a conceptual diagram of a step of manufacturing the graphene wiring structure according to the third embodiment.

At first, a catalyst metal is deposited on the substrate 1 forming the third insulative films 6 thereon, and the metal films 7 are formed on the narrow metal part 2 and the third insulative films 6 on the substrate 1, thereby obtaining the member illustrated in the step conceptual diagram of FIG. 11. A gap is present between the third insulative films 6, and thus a trench is formed by the third insulative films 6. At this time, the metal part 2 is formed such that the substrate 1 is exposed between the metal part 2 and the third insulative films 6.

Then, the third insulative films 6 in the member in the step conceptual diagram of FIG. 11 are released thereby to remove the third insulative films 6. The metal films 7 on the third insulative films 6 are also removed. Hydrocarbon-containing gas is supplied after the release to heat the substrate 1, to precipitate the multilayered graphene from the metal part 2, and thereby to obtain the member including the multilayered graphene 3 as illustrated in the step conceptual diagram of FIG. 12.

Figure 12:
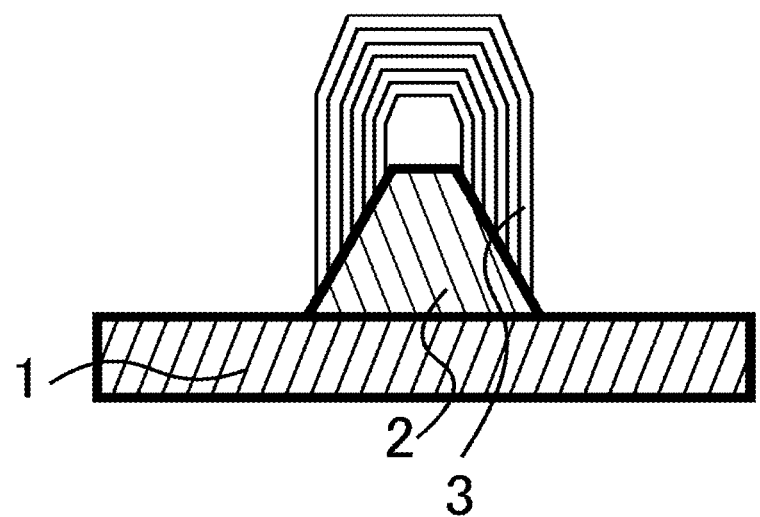
FIG. 12 is a conceptual diagram of a step of manufacturing the graphene wiring structure according to the third embodiment.
Figure 13:
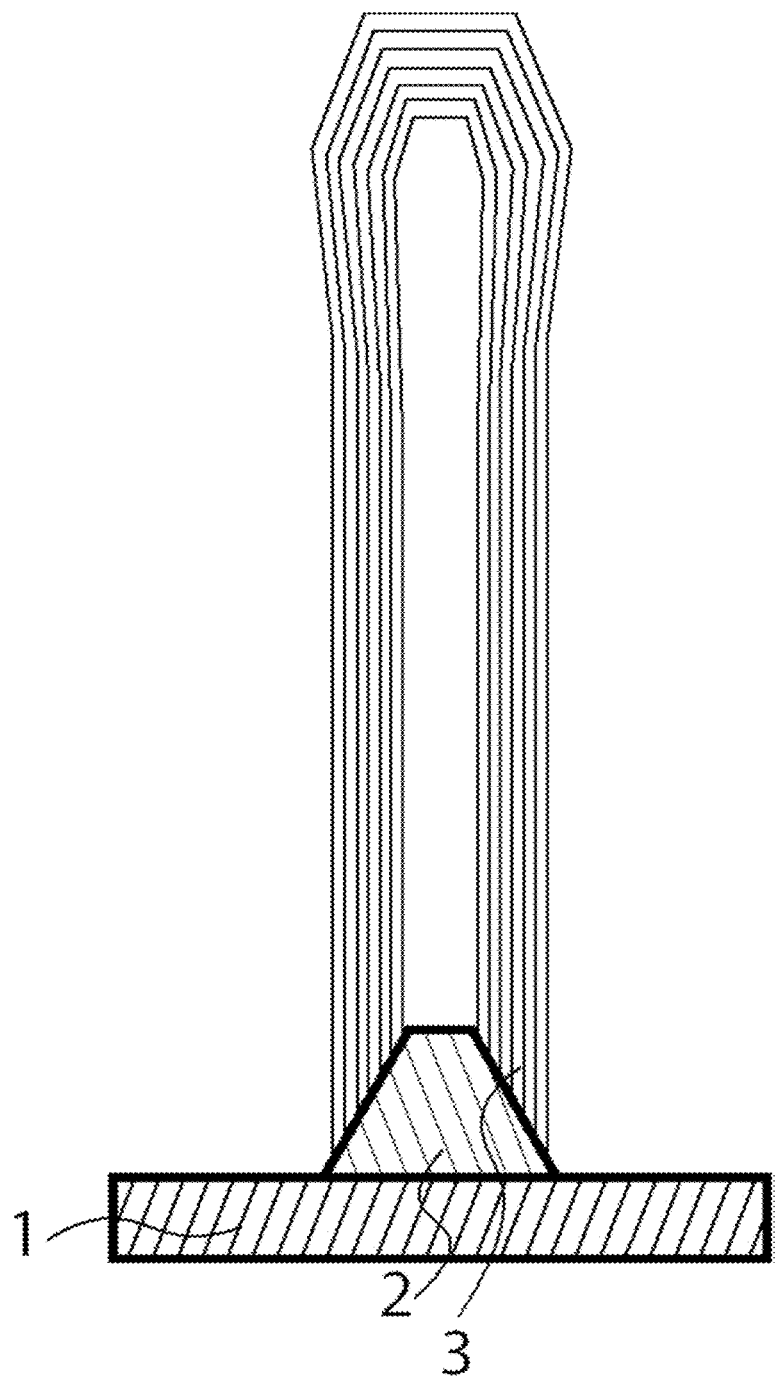
FIG. 13 is a conceptual diagram of a step of manufacturing the graphene wiring structure according to the third embodiment.

Then, hydrocarbon-containing gas is continuously supplied to the member with the multilayered graphene 3 precipitated illustrated in the step conceptual diagram of FIG. 12 to further grow the multilayered graphene 3, thereby obtaining the member illustrated in the step conceptual diagram of FIG. 13.

Then, the fourth insulative film 8 is formed in the member in the step conceptual diagram of FIG. 12 thereby to obtain the member illustrated in the step conceptual diagram of FIG. 13. The fourth insulative film 8 is formed on the substrate 1 thereby to entirely cover the metal part 2 and the multilayered graphene 3.

Figure 14:
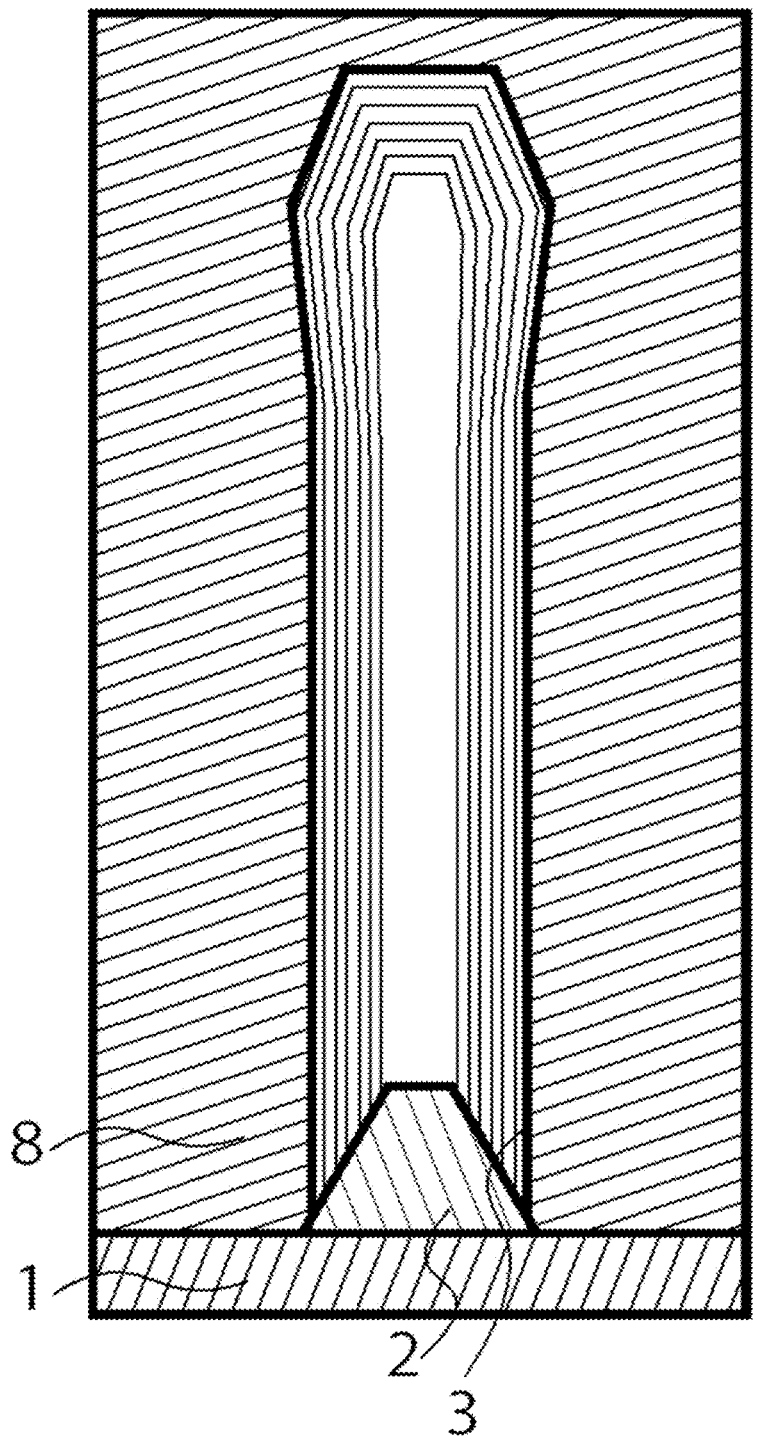
FIG. 14 is a conceptual diagram of a step of manufacturing the graphene wiring structure according to the third embodiment.
Figure 15:
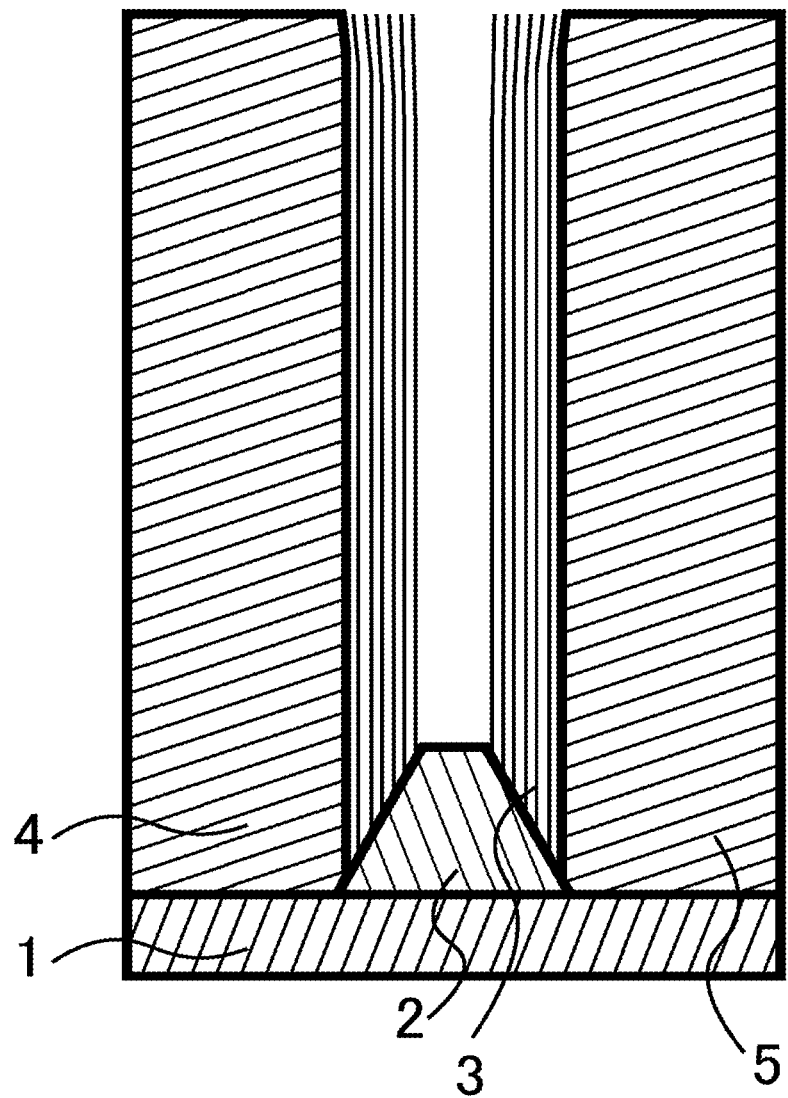
FIG. 15 is a conceptual diagram of a step of manufacturing the graphene wiring structure according to the third embodiment.

Then, CMP is performed on the member illustrated in the step conceptual diagram of FIG. 14 to open the upper end of the multilayered graphene 3, thereby obtaining the member illustrated in the step conceptual diagram of FIG. 15.

Figure 16:
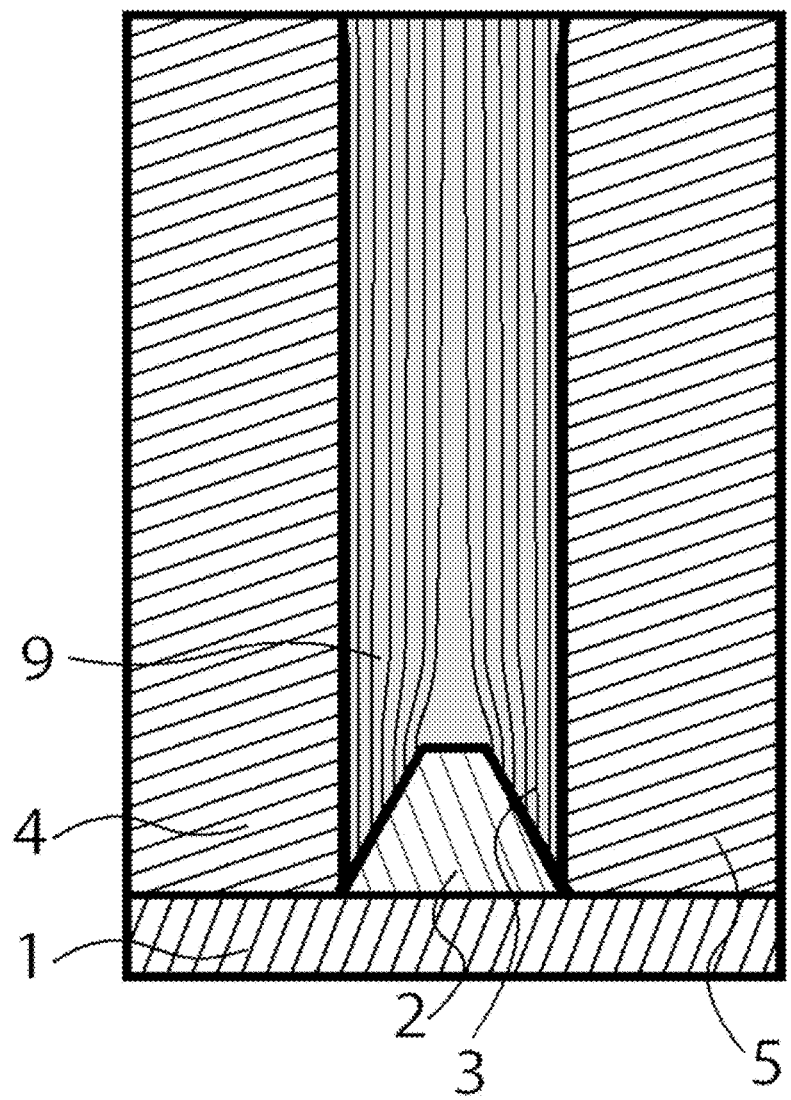
FIG. 16 is a conceptual diagram of a step of manufacturing the graphene wiring structure according to the third embodiment.

Then, the member illustrated in the step conceptual diagram of FIG. 15 is processed in the atmosphere containing the first interlayer substance 9, and the first interlayer substance 9 is inserted into the multilayered graphene 3 to obtain the member illustrated in the step conceptual diagram of FIG. 16, thereby obtaining the graphene wiring structure 102 according to the third embodiment. Further, an insulative film (not illustrated) may be formed on the multilayered graphene 3 in order to prevent the first interlayer substance from leaking.

(Fourth Embodiment)

Figure 17:
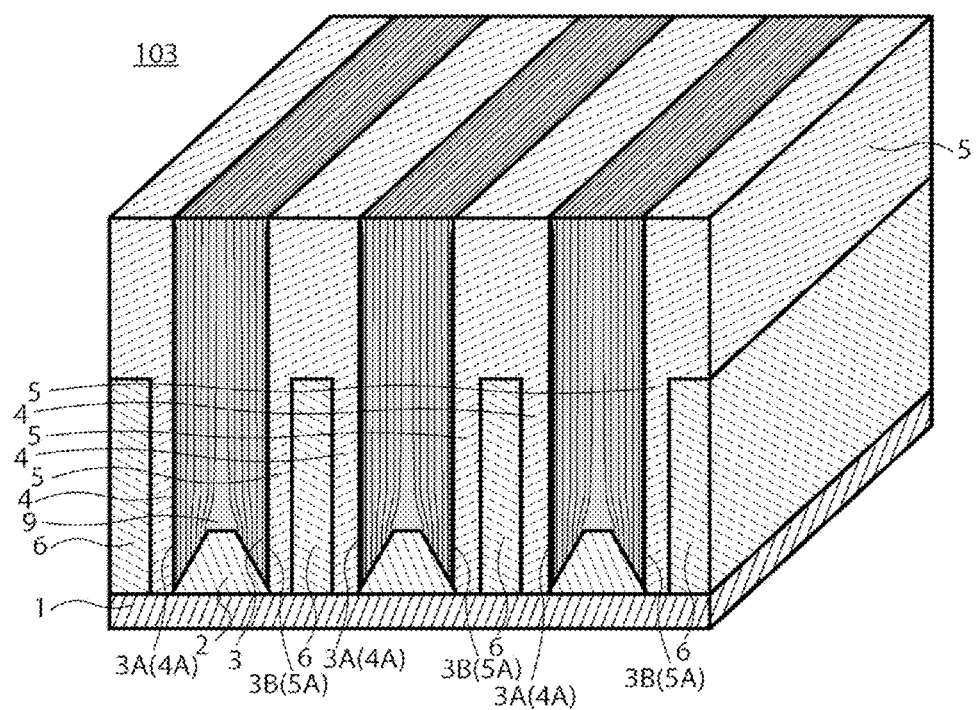
FIG. 17 is a perspective conceptual diagram of a graphene wiring structure according to a fourth embodiment.

A fourth embodiment relates to a graphene wiring structure. The graphene wiring structure 103 according to the fourth embodiment will be described below with reference to the perspective conceptual diagram of FIG. 17. The graphene wiring structure 103 in FIG. 17 comprises the substrate 1, the metal parts 2 with the wiring length direction on the substrate 1 as longitudinal direction, the multilayered graphene 3 connected to the metal parts 2, the first insulative films 4 on the substrate 1, the second insulative films 5 on the substrate 1, the first interlayer substances 9 in the multilayered graphene 3, and the third insulative films 6 on the substrate 1. The third insulative film 6 is present between the first insulative film 4 and the second insulative film 5. The first insulative film 4, the second insulative film 5, or the first insulative film 4 and the second insulative film 5 are present between the third insulative film 6 and the multilayered graphene 3. The fourth embodiment is a variant of the first to third embodiments. The description of the common structure and manufacture method between the first to third embodiments and the fourth embodiment will be omitted.

The graphene wiring structure 103 according to the fourth embodiment is different from the graphene wiring structure 102 according to the third embodiment in that the third insulative films 6 used on the formation of the metal part 2 are included in the graphene wiring structure 103. The third insulative film 6 is present in the first insulative film 4, the second insulative film 5, or the first insulative film 4 and the second insulative film 5 and the third insulative films are previously provided on the growth of the graphene so that the graphene growing direction can be guided in the vertical direction and the graphene wall can be formed to be further aligned in the vertical direction. Further, the third insulative film 6 has different roles in insulative property and low dielectric from the first insulative film 4 and the second insulative film 5, and thus the graphene wiring structure 103 according to the fourth embodiment is advantageous in that both the inter-wiring insulative property and the low capacity can be achieved.

A method for manufacturing the graphene wiring structure according to the fourth embodiment comprises a step of depositing a catalyst metal on a substrate where insulative films are formed with a gap therebetween and barrier layers are formed on the insulative films, and forming a metal part on the substrate between the insulative films, a step of removing the barrier layers, a step of supplying gas containing carbon and hydrogen and forming multilayered graphene from the metal part, a step of forming an insulative film to cover the multilayered graphene, a step of polishing the insulative film to expose the multilayered graphene, and a step of inserting a first interlayer substance in the exposed multilayered graphene. The method for manufacturing the graphene wiring structure 103 according to the fourth embodiment is different from the method for manufacturing the graphene wiring structure 102 according to the third embodiment in that a catalyst metal is deposited in the member where the barrier layers are formed on the insulative films with a gap therebetween and the barrier layer and the catalyst metal on the barrier layers are removed without removing the insulative films.

The method for manufacturing the graphene wiring structure 103 according to the fourth embodiment will be described below with reference to the step conceptual diagrams (cross-section views) of FIG. 18 to FIG. 23.

A member including the substrate 1, the third insulative films 6 on the substrate 1, and the barrier layers 11 on the third insulative films 6 is prepared. Then, a catalyst metal is deposited on the substrate 1 where the third insulative films 6 and the barrier layers 11 are formed, the narrow metal part 2 is formed on the substrate 1, and the metal films 7 are formed on the barrier layers 11 thereby to obtain the member illustrated in the step conceptual diagram of FIG. 18. A gap is present between the third insulative films 6, and thus a trench is formed by the third insulative films 6. At this time, the metal part 2 is formed such that the substrate 1 is exposed between the metal part 2 and the third insulative films 6.

Figure 18:
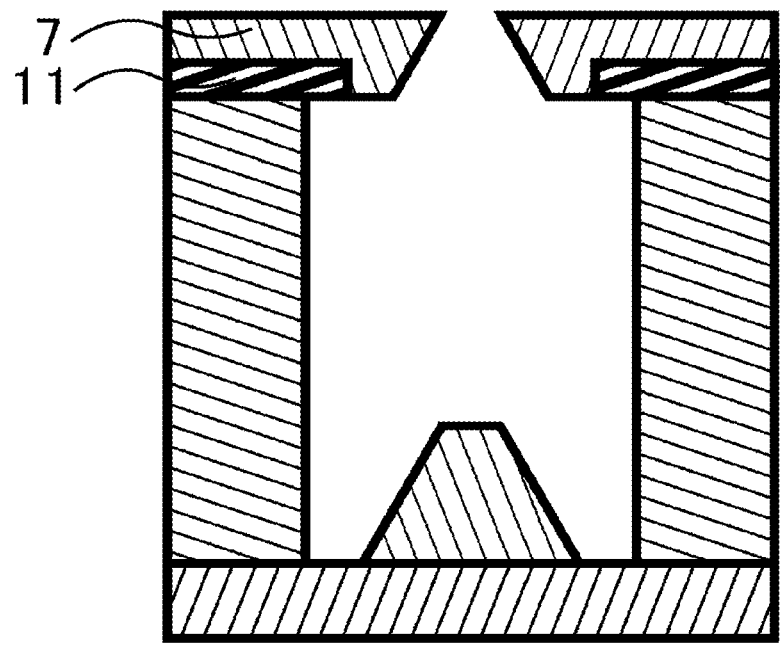
FIG. 18 is a conceptual diagram of a step of manufacturing the graphene wiring structure according to the fourth embodiment.

Then, the barrier layers 11 and the catalyst metal films 7 on the third insulative films 6 in the member illustrated in the step conceptual diagram of FIG. 18 are removed. Then, hydrocarbon-containing gas is supplied to heat the substrate 1, to precipitate the multilayered graphene 3 from the metal part 2, and to obtain the member including the multilayered graphene 3 as illustrated in the step conceptual diagram of FIG. 19.

Figure 19:
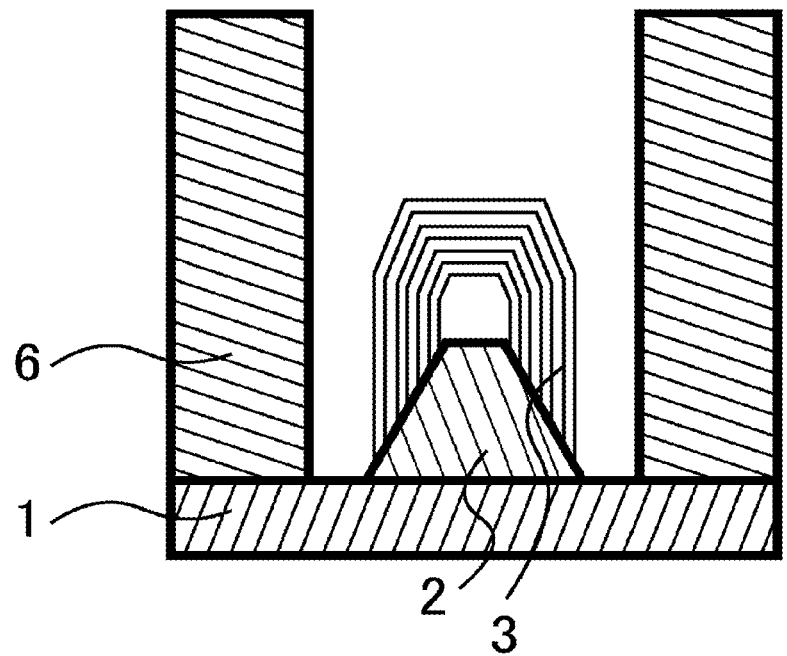
FIG. 19 is a conceptual diagram of a step of manufacturing the graphene wiring structure according to the fourth embodiment.
Figure 20:
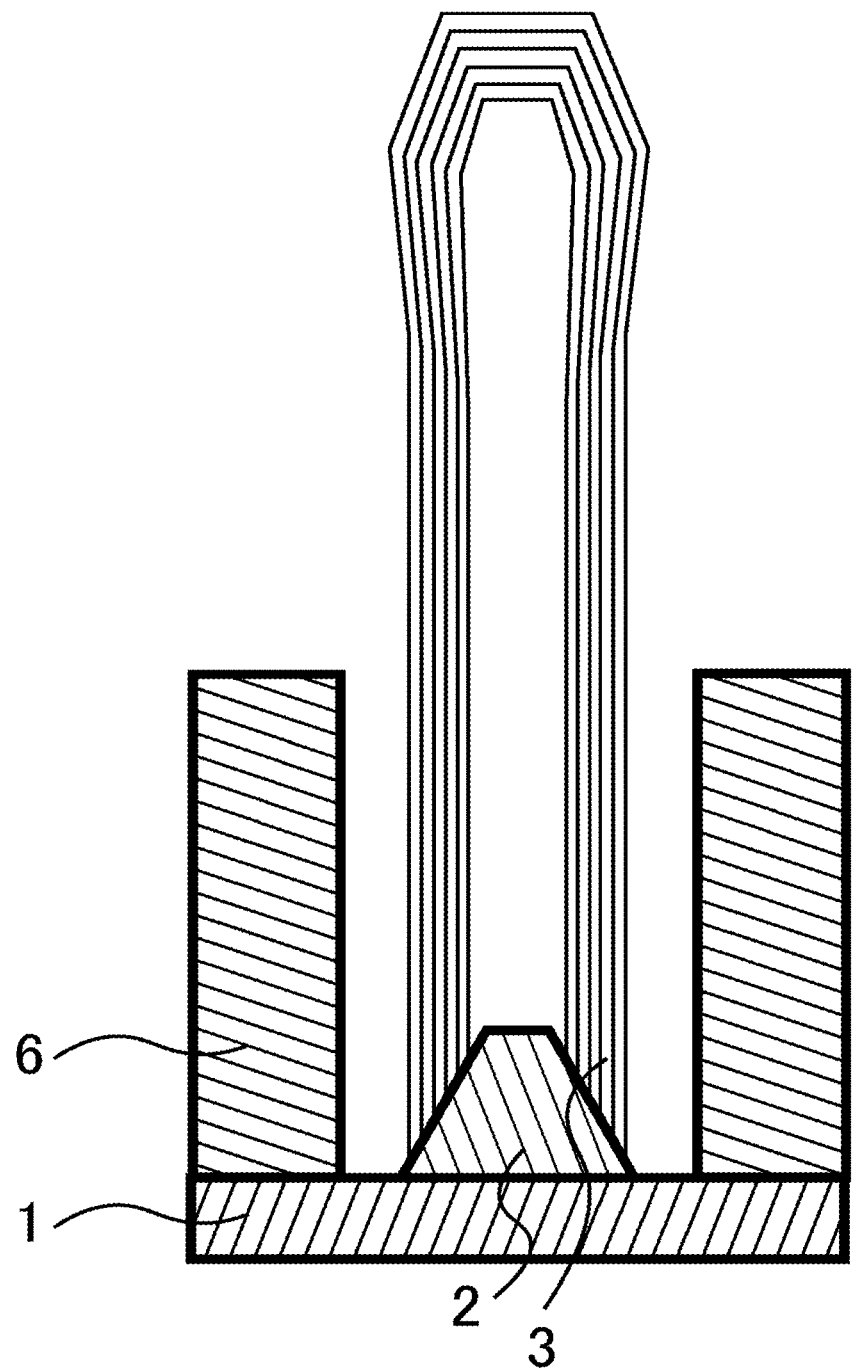
FIG. 20 is a conceptual diagram of a step of manufacturing the graphene wiring structure according to the fourth embodiment.

Then, hydrocarbon-containing gas is continuously supplied to the member where the multilayered graphene 3 is precipitated illustrated in the step conceptual diagram of FIG. 19, thereby to grow the multilayered graphene 3 and to obtain the member illustrated in the step conceptual diagram of FIG. 20.

Figure 21:
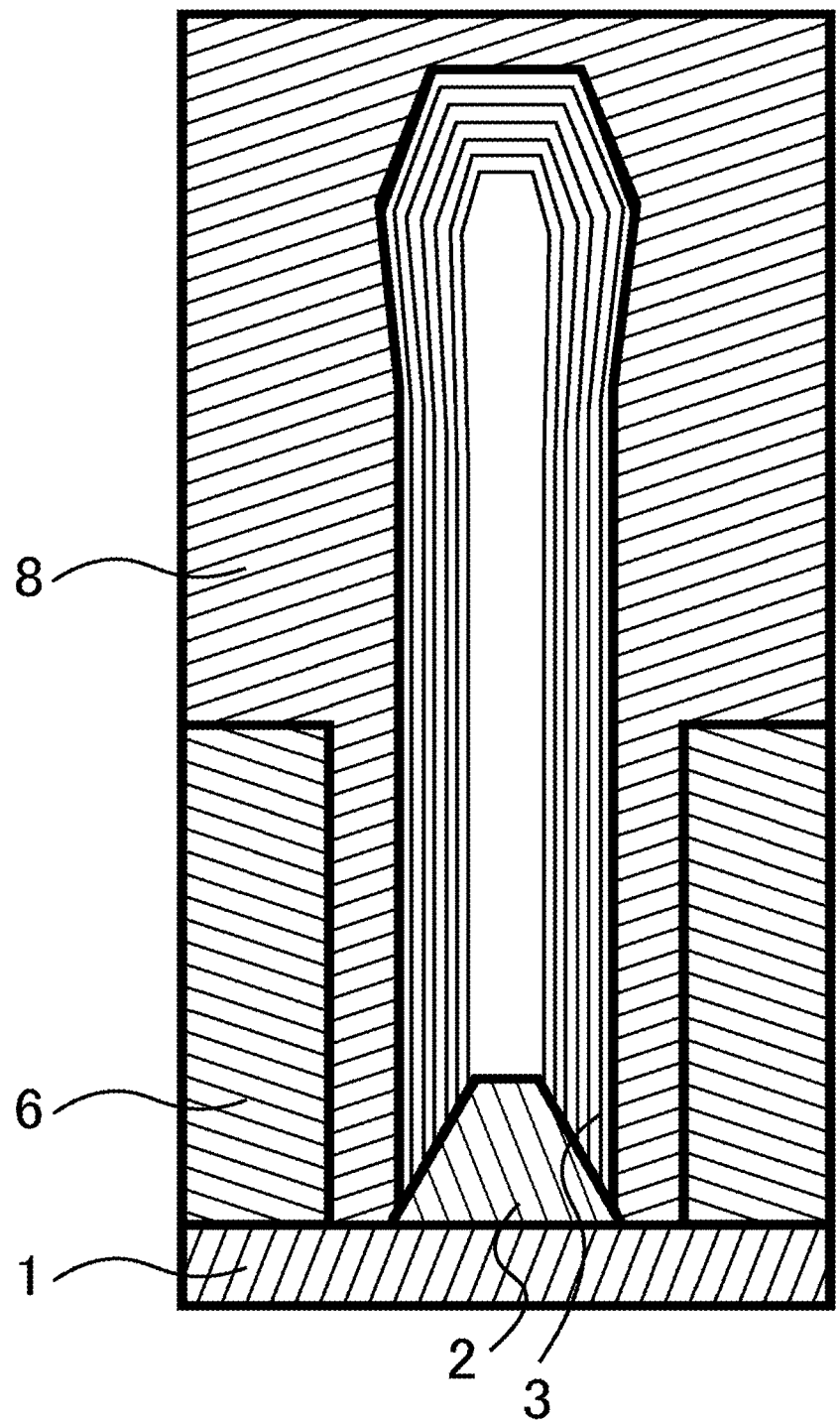
FIG. 21 is a conceptual diagram of a step of manufacturing the graphene wiring structure according to the fourth embodiment.

Then, the fourth insulative film 8 is formed in the member in the step conceptual diagram of FIG. 20 thereby to obtain the member illustrated in the step conceptual diagram of FIG. 21. The fourth insulative film 8 is formed on the substrate 1 to entirely cover the metal part 2 and the multilayered graphene 3.

Figure 22:
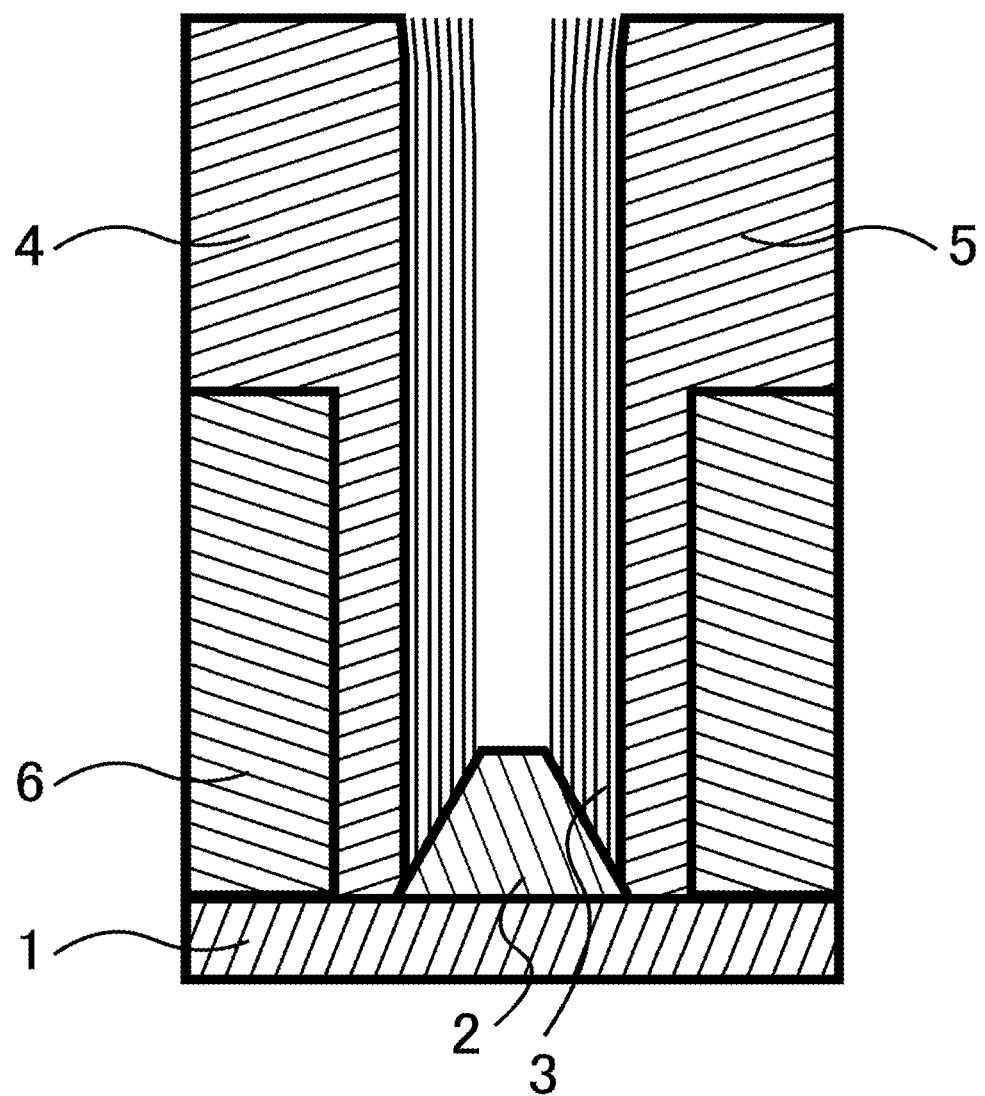
FIG. 22 is a conceptual diagram of a step of manufacturing the graphene wiring structure according to the fourth embodiment.

CMP is then performed on the member illustrated in the step conceptual diagram of FIG. 21 to open the upper end of the multilayered graphene 3, thereby obtaining the member illustrated in the step conceptual diagram of FIG. 22.

Figure 23:
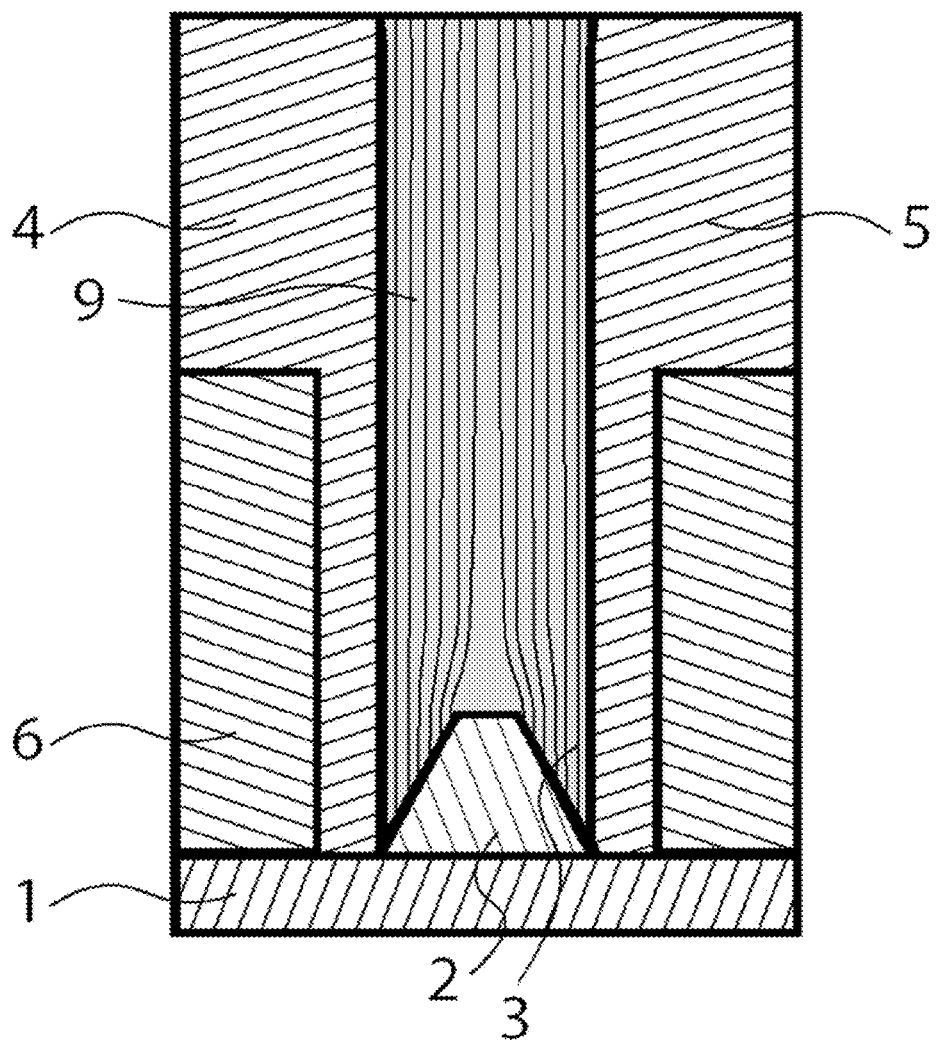
FIG. 23 is a conceptual diagram of a step of manufacturing the graphene wiring structure according to the fourth embodiment.

Then, the member illustrated in the step conceptual diagram of FIG. 22 is processed in the atmosphere containing the first interlayer substance 9, and the first interlayer substance 9 is inserted into the multilayered graphene 3 to obtain the member illustrated in the step conceptual diagram of FIG. 23, thereby obtaining the graphene wiring structure 103 according to the fourth embodiment. Further, an insulative film (not illustrated) may be formed on the multilayered graphene 3 in order to prevent the first interlayer substance from leaking.

(Fifth Embodiment)

Figure 24:
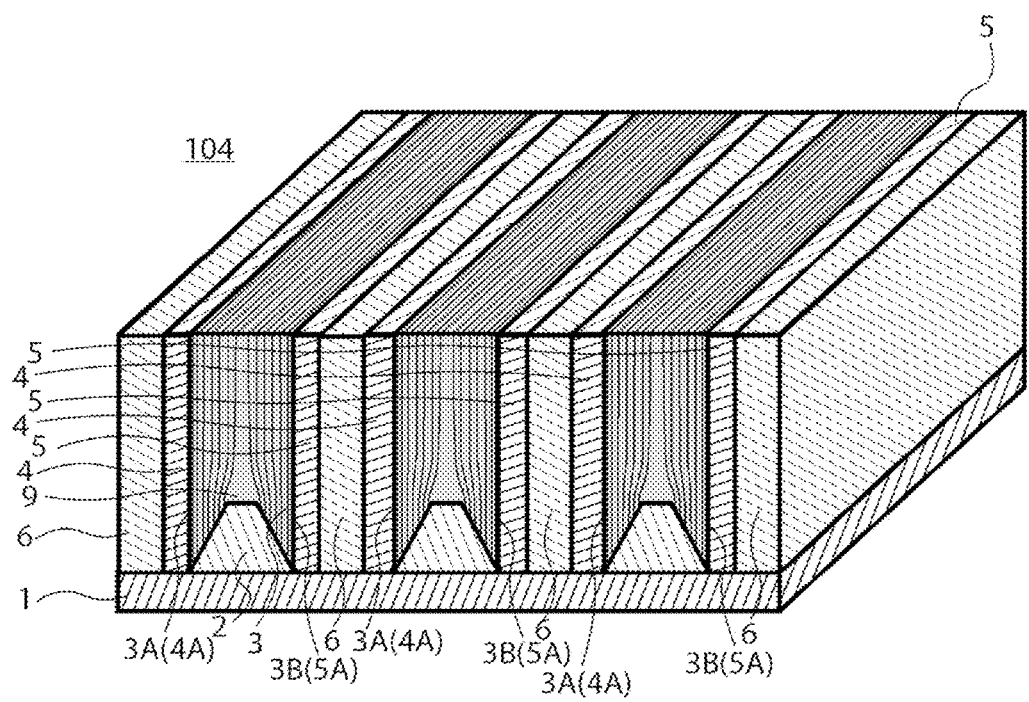
FIG. 24 is a perspective conceptual diagram of a graphene wiring structure according to a fifth embodiment.

A fifth embodiment relates to a graphene wiring structure. The graphene wiring structure 104 according to the fifth embodiment will be described below with reference to the perspective conceptual diagram of FIG. 24. The graphene wiring structure 104 in FIG. 24 comprises the substrate 1, the metal parts 2 with the wiring length direction on the substrate 1 as longitudinal direction, the multilayered graphene 3 connected to the metal parts 2, the first insulative films 4 on the substrate 1, the second insulative films 5 on the substrate 1, the first interlayer substances 9 in the multilayered graphene 3, and the third insulative films 6 on the substrate 1. The third insulative film 6 is present between the multilayered graphene 3 and the first insulative film 4 and between the multilayered graphene 3 and the second insulative film 5. The fifth embodiment is a variant of the first to fourth embodiments. The description of the common structure and manufacture method between the first to fourth embodiments and the fifth embodiment will be omitted.

The graphene wiring structure 104 according to the fifth embodiment is different from the graphene wiring structure 103 according to the fourth embodiment in that the third insulative films 6 are exposed upward. The multilayered graphene 3, the first insulative films 4, the second insulative films 5, and the third insulative films 6 are present on the top of the graphene wiring structure, and thus the graphene wiring structure 104 according to the fifth embodiment is advantageous in that a mechanical intensity can be caused in the vertical interlayer direction of the first insulative films 4 and the second insulative films 5 and the third insulative films 6 can be replaced with a low-dielectric material thereby to reduce an inter-wiring capacity.

A method for manufacturing the graphene wiring structure according to the fifth embodiment comprises a step of depositing a catalyst metal on a substrate where insulative films are formed with a gap therebetween and barrier layers are formed on the insulative films, and forming a metal part on the substrate between the insulative films, a step of removing the barrier layers, a step of supplying gas containing carbon and hydrogen and growing multilayered graphene from the metal part, a step of forming an insulative film to cover the multilayered graphene, a step of polishing the insulative film to expose the multilayered graphene, and a step of inserting a first interlayer substance into the exposed multilayered graphene. The method for manufacturing the graphene wiring structure 103 according to the fourth embodiment is different from the method for manufacturing the graphene wiring structure 102 according to the third embodiment in that a catalyst metal is deposited in the member where the barrier layers are formed on the insulative films with a gap therebetween and the barrier layers and the catalyst metal on the barrier layers are removed without removing the insulative films.

The method for manufacturing the graphene wiring structure 104 according to the fifth embodiment will be described below with reference to the step conceptual diagrams (cross-section views) of FIG. 25 and FIG. 26. The method for manufacturing the graphene wiring structure 103 according to the fourth embodiment illustrated in the step conceptual diagrams of FIG. 18 to FIG. 21 is common with the method for manufacturing the graphene wiring structure 104 according to the fifth embodiment.

Figure 25:
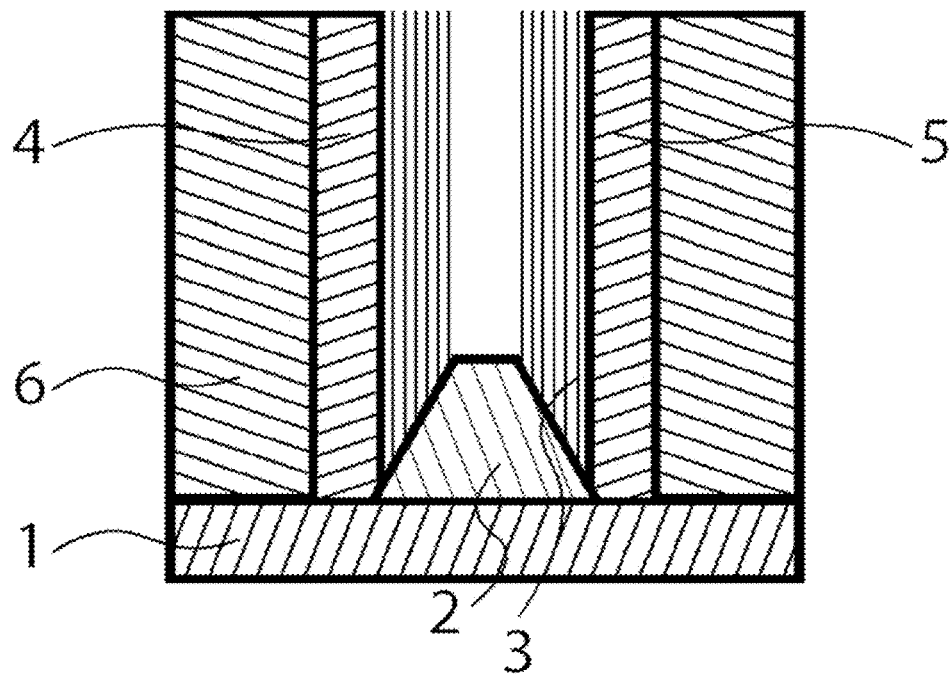
FIG. 25 is a conceptual diagram of a step of manufacturing the graphene wiring structure according to the fifth embodiment.

CMP is performed on the member illustrated in the step conceptual diagram of FIG. 21 until the upper end of the multilayered graphene 3 is opened and the third insulative films 6 are exposed, thereby obtaining the member illustrated in the step conceptual diagram of FIG. 25.

Figure 26:
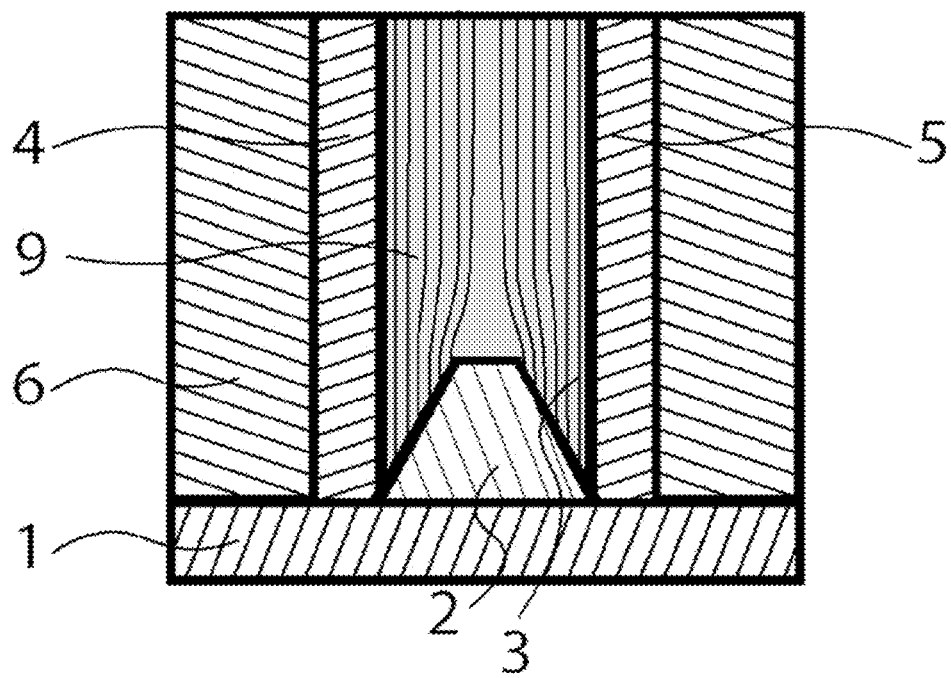
FIG. 26 is a conceptual diagram of a step of manufacturing the graphene wiring structure according to the fifth embodiment.

The member illustrated in the step conceptual diagram of FIG. 25 is then processed in the atmosphere containing the first interlayer substance 9, and the first interlayer substance 9 is inserted into the multilayered graphene 3 to obtain the member illustrated in the step conceptual diagram of FIG. 26, thereby obtaining the graphene wiring structure 104 according to the fifth embodiment. Further, an insulative film (not illustrated) may be formed on the multilayered graphene in order to prevent the first interlayer substance from leaking.

(Sixth Embodiment)

Figure 27:
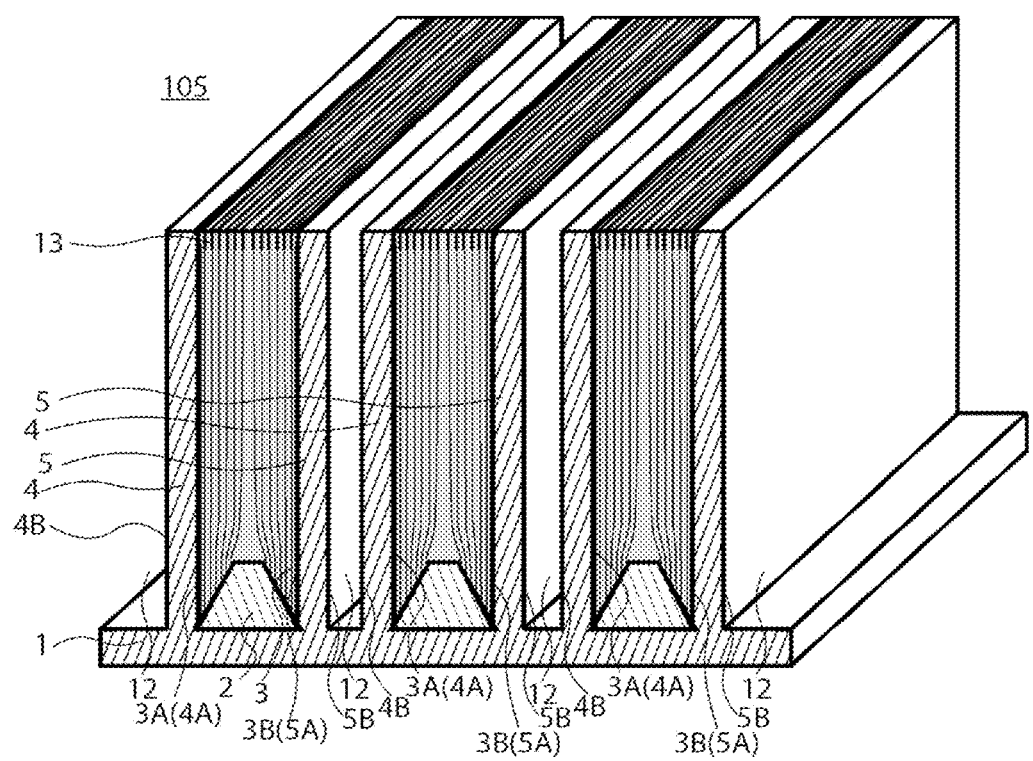
FIG. 27 is a perspective conceptual diagram of a graphene wiring structure according to a sixth embodiment.

A sixth embodiment relates to a graphene wiring structure. The graphene wiring structure 105 according to the sixth embodiment will be described below with reference to the perspective conceptual diagram of FIG. 27. The graphene wiring structure 105 in FIG. 27 comprises the substrate 1, the metal parts 2 with the wiring length direction on the substrate 1 as longitudinal direction, the multilayered graphene 3 connected to the metal parts 2, the first insulative films 4 on the substrate 1, the second insulative films 5 on the substrate 1, the first interlayer substance 9 in the multilayered graphene 3, gap layers 12 between the first insulative film 4 and the second insulative film 5, and a second interlayer substance 13 in the multilayered graphene 3 on its end opposite to the substrate 1. The fourth embodiment is a variant of the first to third embodiments. The description of the common structure and manufacture method between the first to third embodiments and the fourth embodiment will be omitted.

The gap layers 12 are introduced in order to reduce the inter-wiring capacity in the graphene wiring structure 105. The gap layer 12 is a vacuum or air layer called air gap.

The second interlayer substance 13 is preferably one or more among metal oxides, metal nitrides, and metal carbides. The metal oxides, the metal nitrides, and the metal carbides are metal compounds (oxides, nitrides, and carbides) containing at least one metal selected from the group consisting of; Fe, Cu, Al, and Mo. The second interlayer substance 13 is a more stable compound than the first interlayer substance 9, and thus it is preferable to prevent the first interlayer substance 9 from leaking. The end of the multilayered graphene 3 inserting the second interlayer substance 13 therein opposite to the substrate 1 is indicated in a bold line. In this way, the second interlayer substance is present on the upper end of the multilayered graphene 3 thereby to prevent the first interlayer substance 9 from leaking.

Specific examples of the metal oxides may be at least one metal oxide selected from the group consisting of; $Fe_2O_3$, CuO, $Al_2O_3$, $MoO_2$, and the like. Specific examples of the metal nitrides may be at least one metal nitride selected from the group consisting of; $Fe_3N$, $Cu_3N_2$, AlN, $MoN_x$, and the like. Specific examples of the metal carbides may be at least one metal carbide selected from the group consisting of; $Fe_3C$, $Cu_2C$, $Al_4C_3$, $Mo_2C$, and the like.

A method for manufacturing the graphene wiring structure according to the sixth embodiment comprises a step of depositing a catalyst metal on a substrate where insulative films are formed with a gap therebetween and barrier layers are formed on the insulative films, and forming a metal part on the substrate between the insulative films, a step of removing the barrier layers, a step of supplying gas containing carbon and hydrogen and growing multilayered graphene from the metal part, a step of forming an insulative film to cover the multilayered graphene, a step of polishing the insulative film to expose the multilayered graphene, a step of inserting a first interlayer substance into the exposed multilayered graphene, a step of forming a second interlayer substance on the end of the multilayered graphene opposite to the substrate, and a step of removing the insulative films present on the substrate on the growth of the multilayered graphene thereby to form gap layers. The method for manufacturing the graphene wiring structure according to the sixth embodiment is different from the method for manufacturing the graphene wiring structure according to the fifth embodiment in that the insulative films present on the substrate on the growth of the multilayered graphene are removed thereby to form the gap layers and the second interlayer substance is formed on the tip end of the multilayered graphene 3.

The method for manufacturing the graphene wiring structure 105 according to the sixth embodiment will be described below with reference to the step conceptual diagrams (cross-section views) of FIG. 28 to FIG. 35.

A member including the substrate 1, the third insulative films 6 on the substrate 1, and the barrier layers 11 on the third insulative films 6 is prepared. Then, a catalyst metal is deposited on the substrate 1 where the third insulative films 6 and the barrier layers 11 are formed to form the narrow metal part 2 on the substrate 1 and the metal films 7 on the barrier layers 11, thereby obtaining the member illustrated in the step conceptual diagram of FIG. 28. A gap is present between the third insulative films 6, and thus a trench is formed by the third insulative films 6. At this time, the metal part 2 is formed such that the substrate 1 is exposed between the metal part 2 and the third insulative films 6.

Figure 28:
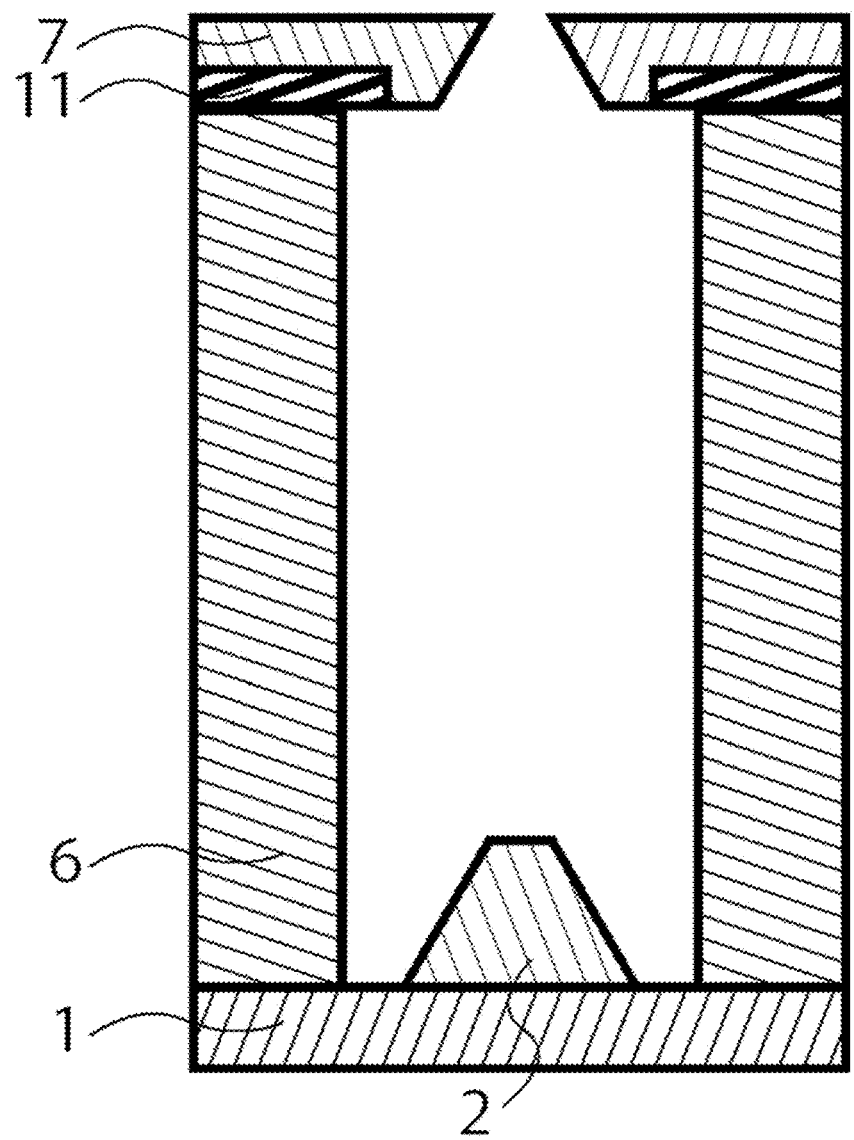
FIG. 28 is a conceptual diagram of a step of manufacturing the graphene wiring structure according to the sixth embodiment.

Then, the barrier layers 11 and the catalyst metal films 7 on the third insulative films 6 in the member illustrated in the step conceptual diagram of FIG. 28 are removed. Then, hydrocarbon-containing gas is supplied to heat the substrate 1, to precipitate the multilayered graphene 3 from the metal part 2, and thereby to obtain the member including the multilayered graphene 3 as illustrated in the step conceptual diagram of FIG. 29.

Figure 29:
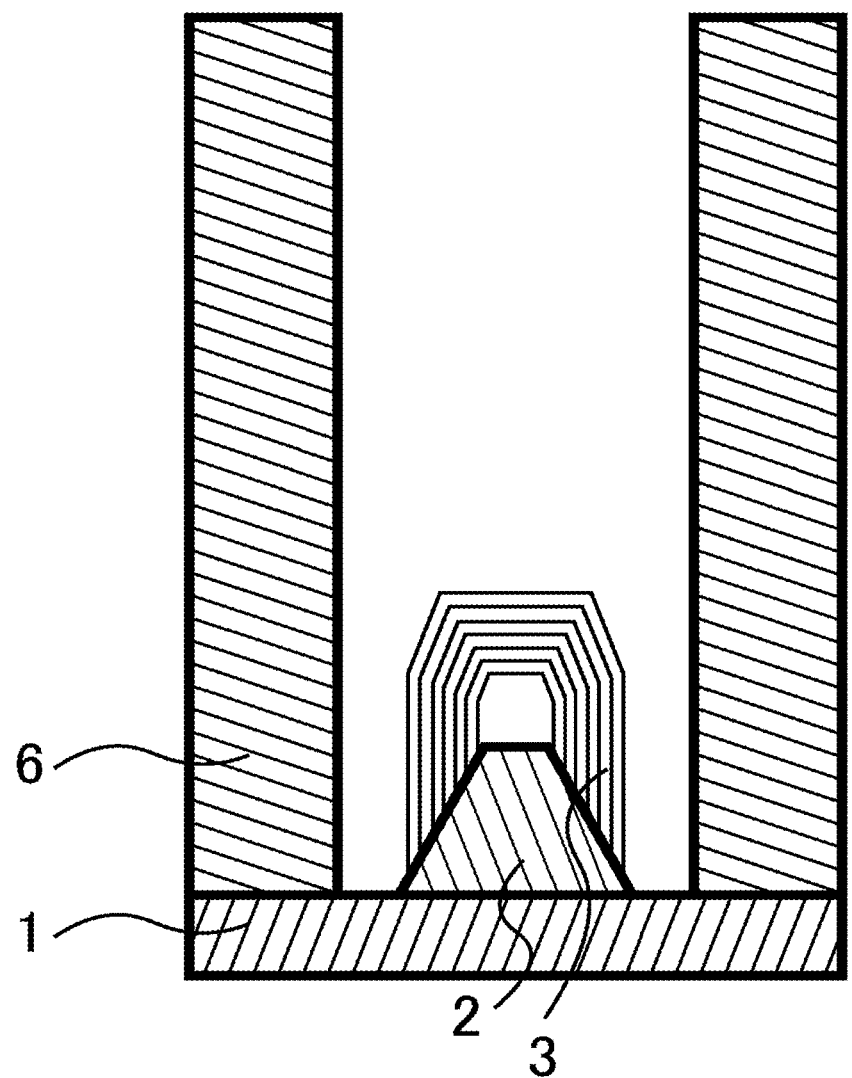
FIG. 29 is a conceptual diagram of a step of manufacturing the graphene wiring structure according to the sixth embodiment.
Figure 30:
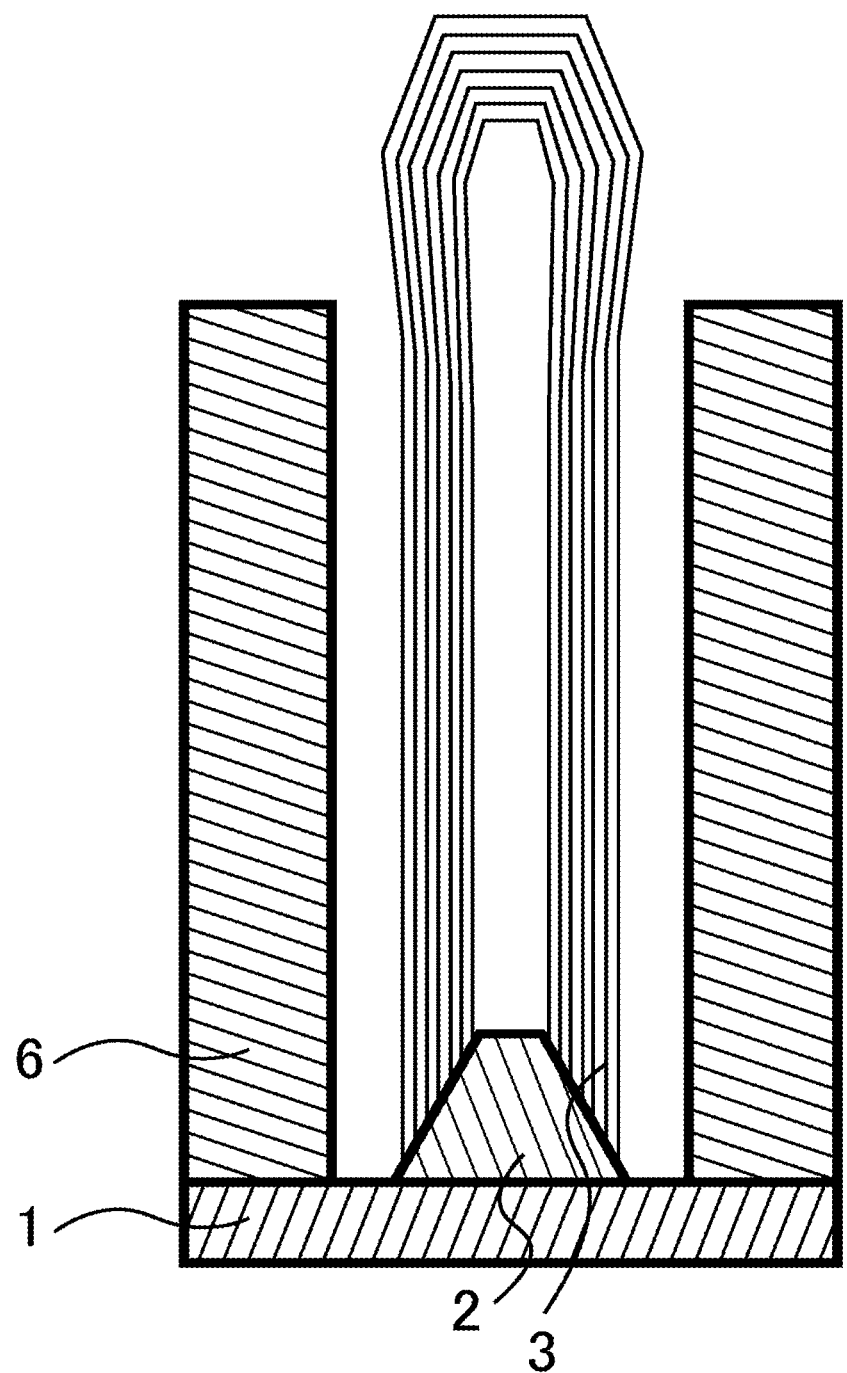
FIG. 30 is a conceptual diagram of a step of manufacturing the graphene wiring structure according to the sixth embodiment.

Then, hydrocarbon-containing gas is continuously supplied to the member where the multilayered graphene 3 is precipitated illustrated in the step conceptual diagram of FIG. 29, to further grow the multilayered graphene 3, and thereby to obtain the member illustrated in the step conceptual diagram of FIG. 30.

Figure 31:
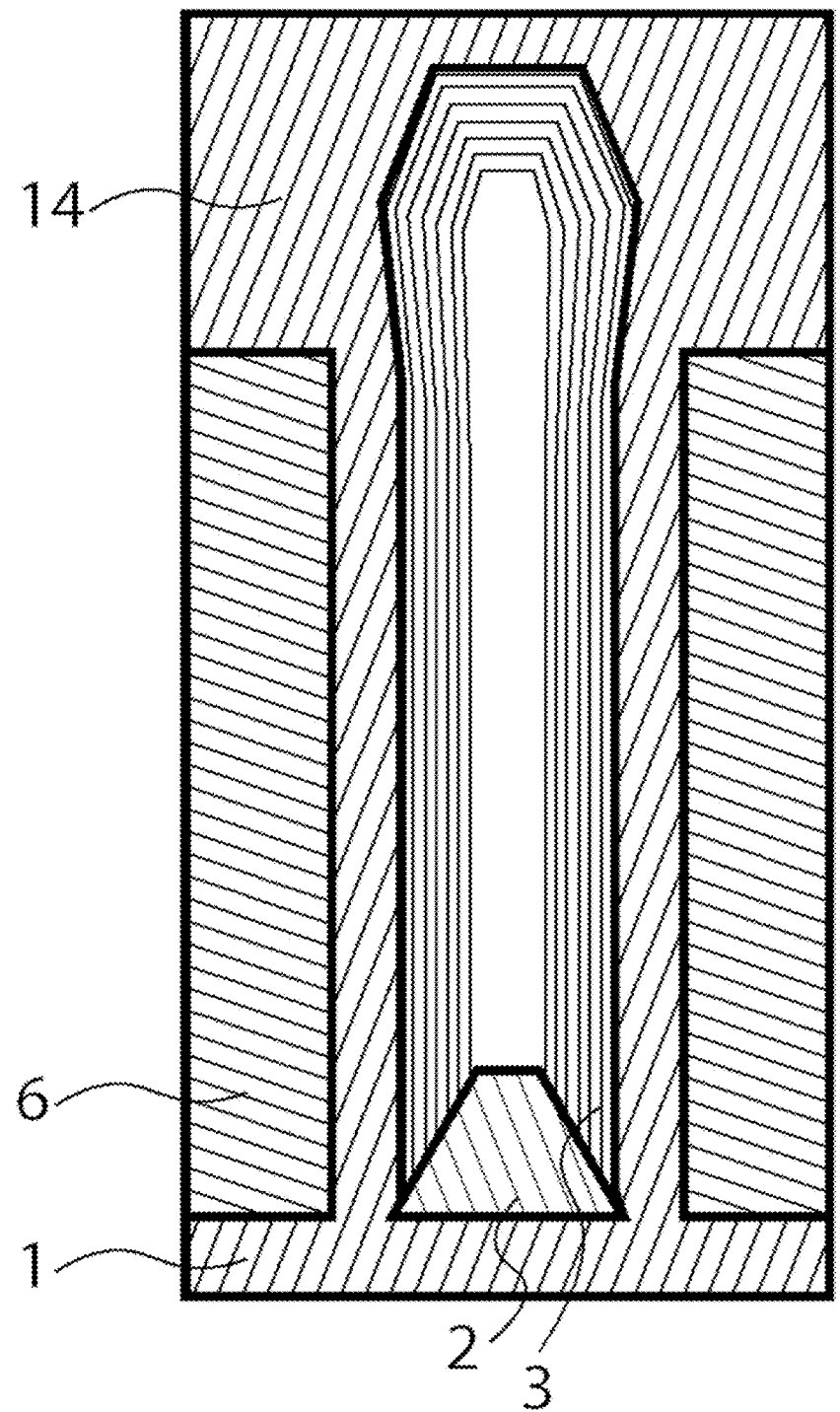
FIG. 31 is a conceptual diagram of a step of manufacturing the graphene wiring structure according to the sixth embodiment.

Then, a sixth insulative film 14 is formed in the member in the step conceptual diagram of FIG. 30 thereby to obtain the member illustrated in the step conceptual diagram of FIG. 31. The sixth insulative film 14 is formed on the substrate 1 thereby to entirely cover the metal part 2 and the multilayered graphene 3. The sixth insulative film 14 becomes the first insulative film 4 and the second insulative film 5 in a later step. Then, it is preferable that the materials of the third insulative film 6 and the sixth insulative film 14 are selected in consideration of etching selectivity such that the sixth insulative film 14 is left when the third insulative films 6 are removed. For example, it is preferable that the third insulative film 6 employs a resist material and the sixth insulative film 14 is made of the same material as the substrate 1, such as $Al_2O_3$ or TiN, by ALD (Atomic Layer Deposition).

Figure 32:
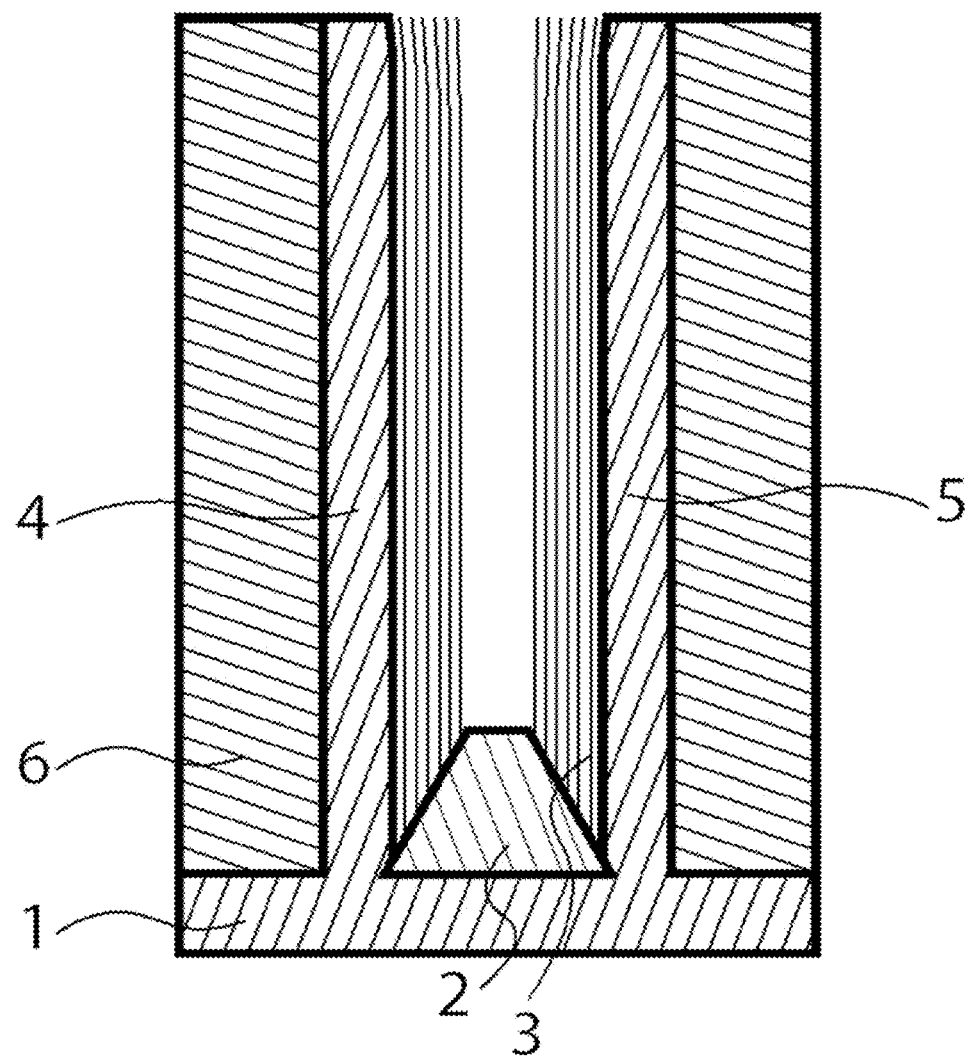
FIG. 32 is a conceptual diagram of a step of manufacturing the graphene wiring structure according to the sixth embodiment.

CMP is performed on the member illustrated in the step conceptual diagram of FIG. 31 until the upper end of the multilayered graphene 3 is opened and the third insulative films are exposed, thereby obtaining the member illustrated in the step conceptual diagram of FIG. 32.

Figure 33:
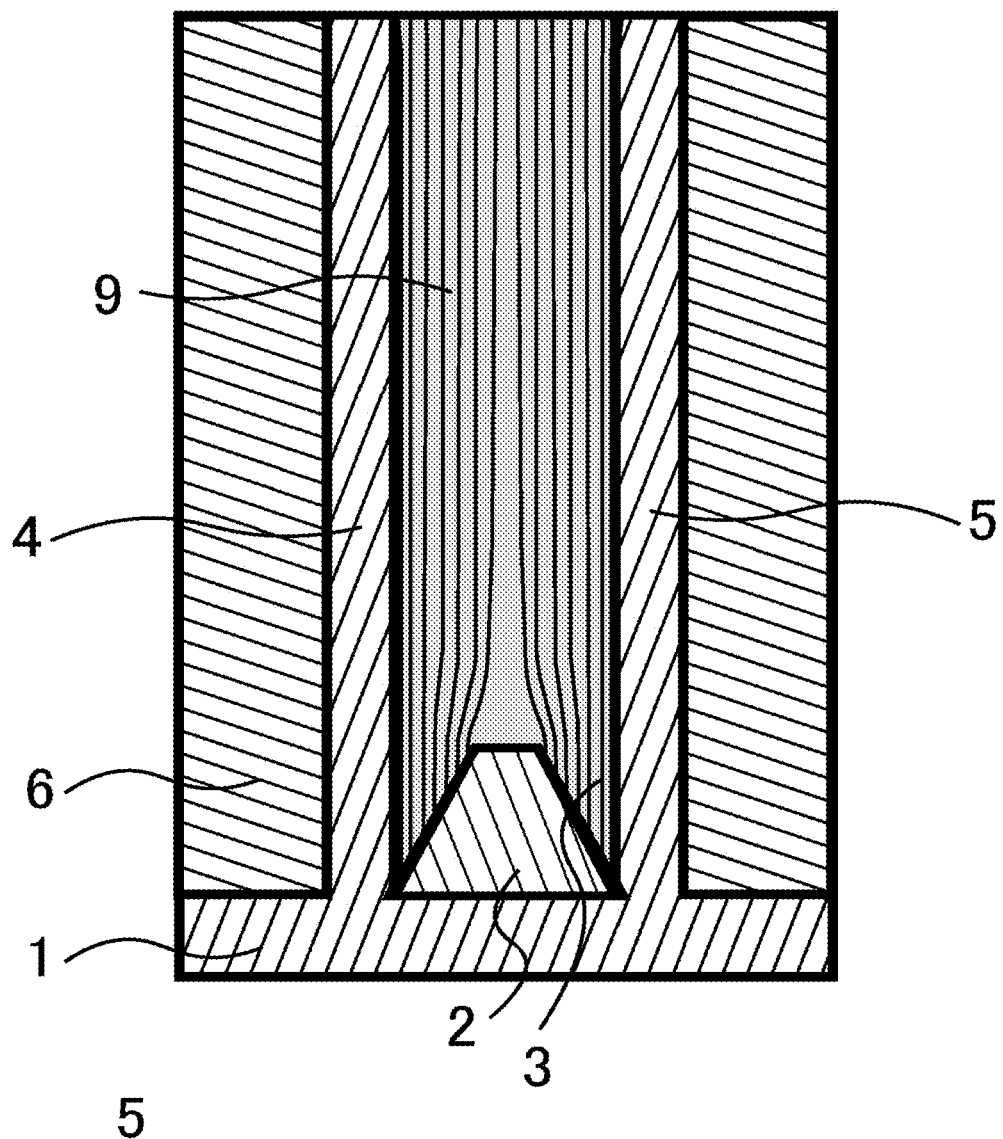
FIG. 33 is a conceptual diagram of a step of manufacturing the graphene wiring structure according to the sixth embodiment.

Then, the member illustrated in the step conceptual diagram of FIG. 32 is processed in the atmosphere containing the first interlayer substance 9, and the first interlayer substance 9 is inserted into the multilayered graphene 3 to obtain the member illustrated in the step conceptual diagram of FIG. 33, thereby obtaining the graphene wiring structure 104 according to the fifth embodiment.

Figure 34:
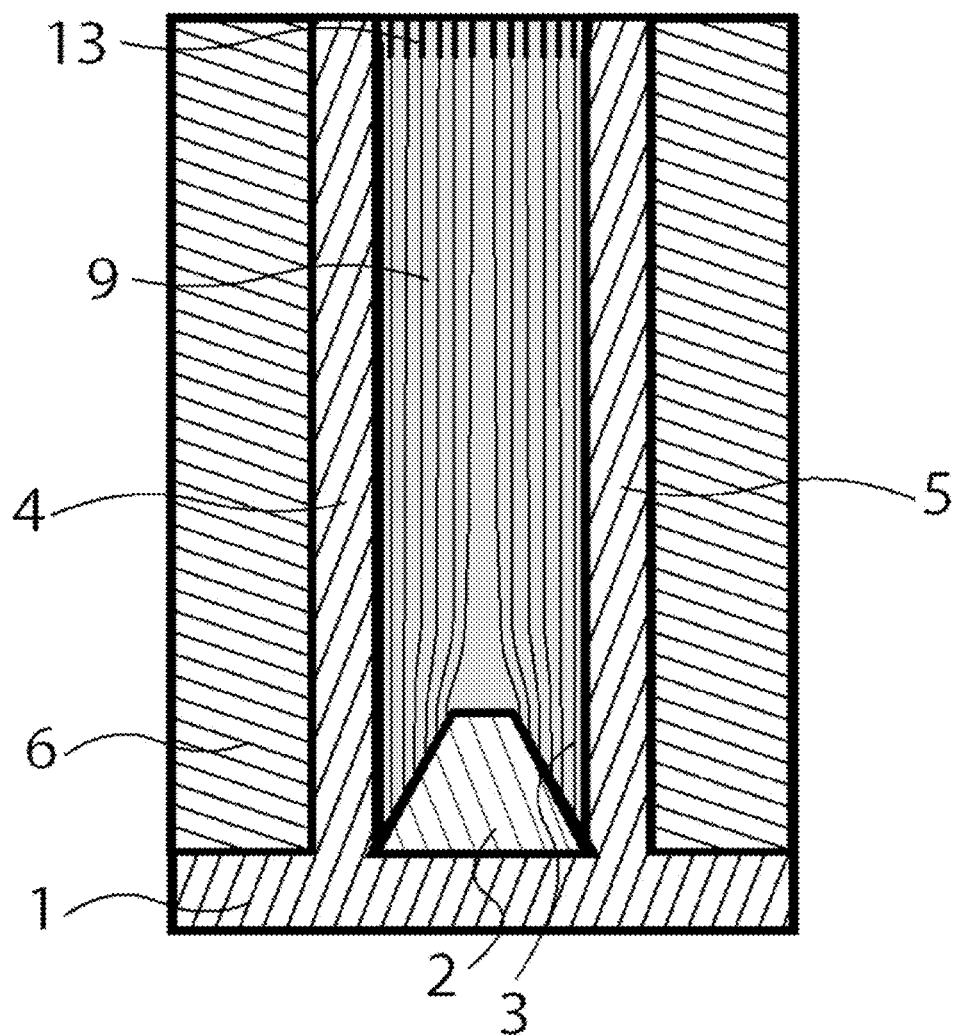
FIG. 34 is a conceptual diagram of a step of manufacturing the graphene wiring structure according to the sixth embodiment.

Then, the member illustrated in the step conceptual diagram of FIG. 33 is processed by at least one selected from the group consisting of; oxidizing gas, nitriding gas and carbonizing gas thereby to obtain the member where the second interlayer substance 13 is formed illustrated in the step conceptual diagram of FIG. 34. When the first interlayer substance 9 is a metal chloride which reacts with oxidizing gas, nitriding gas or carbonizing gas thereby to form oxide, nitride, or carbide, the oxidizing gas, the nitriding gas, or the carbonizing gas may not contain a metal. Further, when the first interlayer substance 9 is other than the metal chlorides, it is preferable that the processing atmosphere in the present step contains at least one metal reacting with oxidizing gas, nitriding gas, or carbonizing gas, selected from the group consisting of; such as Fe, Cu, Al, and Mo.

Figure 35:
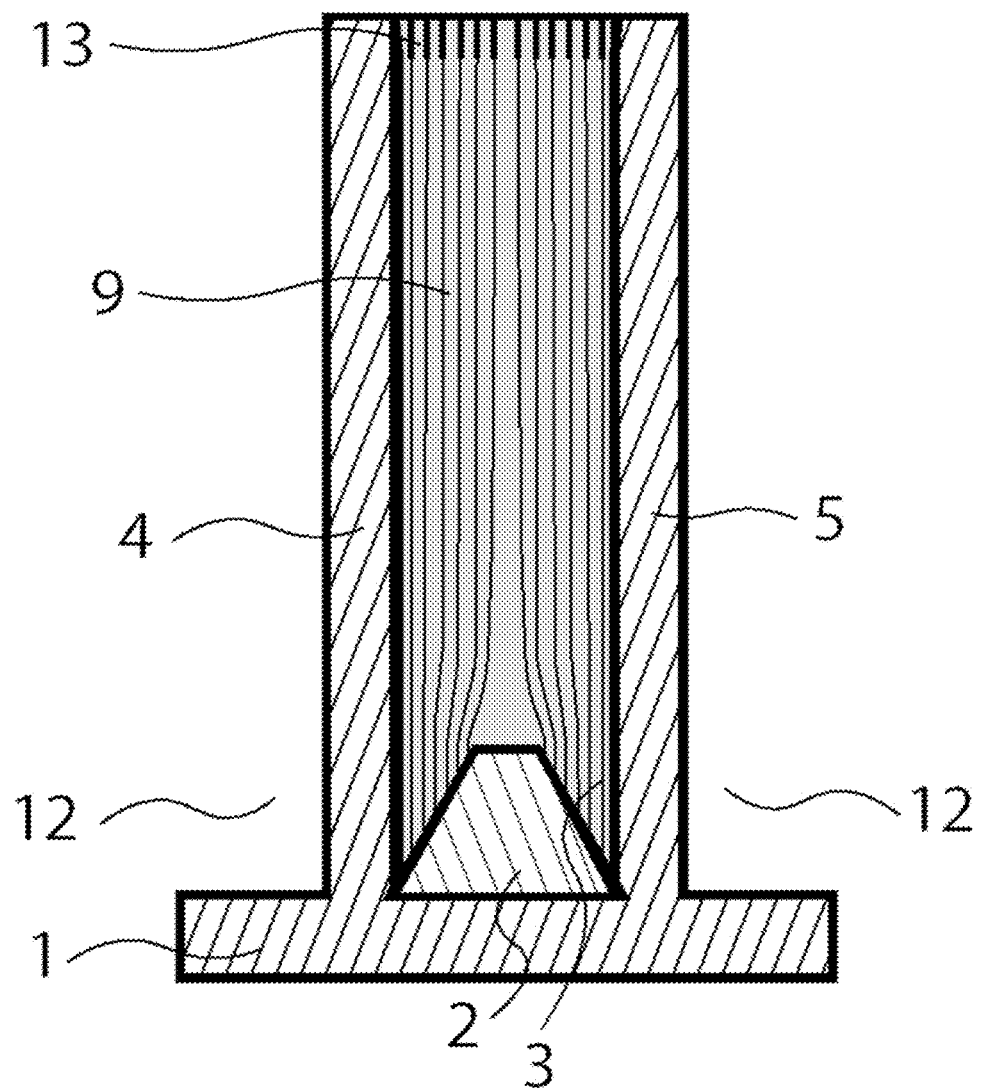
FIG. 35 is a conceptual diagram of a step of manufacturing the graphene wiring structure according to the sixth embodiment.

The member illustrated in the step conceptual diagram of FIG. 34 is then etched to remove the third insulative films 6, thereby obtaining the member including the gap layers 12 illustrated in the step conceptual diagram of FIG. 35. The areas of the third insulative films 6 are assumed as the gap layers 12.

Some of the elements in the specification are indicated by only elemental symbols.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A graphene wiring structure comprising:
a substrate;
a metal part on the substrate;
multilayered graphene being in direct contact with the metal part;
a first insulative film on the substrate; and
a second insulative film on the substrate, wherein
the metal part is present between the first insulative film and the second insulative film,
a side face of the first insulative film vertical to the substrate opposes a side face of the second insulative film vertical to the substrate,
a first outer face of the multilayered graphene is at least partly in direct contact with a first side face of the first insulative film vertical to the substrate,
a second outer face of the multilayered graphene is at least partly in direct contact with a second side face of the second insulative film vertical to the substrate,
the multilayered graphene sandwiches the metal part,
the first insulative film and the second insulative film sandwiches the multilayered graphene and the metal part,
one edge of the multilayered graphene is in direct contact with the metal part, and
the other edge of the multilayered graphene being opposite to the one edge is unconnected to the metal part.

2. The structure according to claim 1,
wherein the metal part is of a ridge type shape.

3. The structure according to claim 1,
wherein when a wiring width as a distance from the first outer face of the multilayered graphene to the second outer face is assumed as W, and
a wiring length as a length of the multilayered graphene vertical in the wiring width direction and parallel to the surface of the substrate is assumed as L,
the W and L meet L/W ≥3.

4. The structure according to claim 1,
wherein the wiring length direction is a longitudinal direction.

5. The structure according to claim 1,
wherein the multilayered graphene is multilayered graphene in which a first interlayer substance is present between its layers.

6. The structure according to claim 5,
wherein the first interlayer substance is further present between the first outer face of the multilayered graphene being unconnected to the first side face of the first insulative film and the first side face of the first insulative film, and
the first interlayer substance is further present between the second outer face of the multilayered graphene being unconnected to the second side face of the second insulative film and the second side face of the second insulative film.

7. The structure according to claim 1,
wherein a gap layer is provided between the first insulative film and the second insulative film.

8. The structure according to claim 1,
wherein a second interlayer substance is present between layers in the multilayered graphene at the end of the multilayered graphene opposite to the substrate, and
the second interlayer substance contains one or more from among oxides, nitrides, and carbides.

9. The structure according to claim 1,
wherein a wiring width of the multilayered graphene is between 1 nm and 20 nm.

10. The structure according to claim 5, wherein the first interlayer substance contains one or more first interlayer substances at least one selected from the group consisting of; metal chlorides, metal fluorides, alkali metals, alkali earth metals, halogens, and interhalogen compounds.

11. The structure according to claim 1,
wherein the substrate includes aluminum oxide or titanium oxide.

12. The structure according to claim 1, wherein the metal part includes a metal or alloy containing Fe, Ta, or Mo.

13. The structure according to claim 1, wherein a width of the metal part is between 1 nm and 20 nm.

14. The wiring according to claim 1, wherein the metal part, the first insulative film and the second insulative film are in direct contact with the substrate.

15. The wiring according to claim 1, wherein
a height of the first insulative film from the substrate is larger than a height of the metal part from the substrate, and
a height of the second insulative film from the substrate is larger than a height of the metal part from the substrate.

* * * * *